(12) United States Patent
Kochi et al.

(10) Patent No.: US 7,329,867 B2
(45) Date of Patent: Feb. 12, 2008

(54) ELECTRON BEAM SYSTEM AND ELECTRON BEAM MEASURING AND OBSERVING METHODS

(75) Inventors: Nobuo Kochi, Tokyo (JP); Hirotami Koike, Tokyo (JP); Yasuko Tsuruga, Tokyo (JP); Shinichi Okada, Tokyo (JP)

(73) Assignee: Topcon Corporation, Tokyo (JP)

( * ) Notice: Subject to any disclaimer, the term of this patent is extended or adjusted under 35 U.S.C. 154(b) by 0 days.

(21) Appl. No.: 11/505,872

(22) Filed: Aug. 18, 2006

(65) Prior Publication Data

US 2006/0289757 A1 Dec. 28, 2006

Related U.S. Application Data

(62) Division of application No. 10/897,434, filed on Jul. 23, 2004, now Pat. No. 7,151,258.

(30) Foreign Application Priority Data

Jul. 24, 2003 (JP) ............................ 2003-279386
Aug. 28, 2003 (JP) ............................ 2003-305191

(51) Int. Cl.
*H01J 37/28* (2006.01)
(52) U.S. Cl. ..................................... 250/310
(58) Field of Classification Search ................ 250/310
See application file for complete search history.

(56) References Cited

U.S. PATENT DOCUMENTS 6,852,974 B2* 2/2005 Kochi et al. ................ 250/311

(Continued)

FOREIGN PATENT DOCUMENTS

JP 2002-270126 A 9/2002

(Continued)

OTHER PUBLICATIONS

K. Ebihara, "Medical and Biological Electron Microscope Observation Method," Japanese Society of Electron Microscopy, Jan. 20, 1982 (4th edition Aug. 20, 1988), pp. 278-299.

*Primary Examiner*—Kiet T. Nguyen
(74) *Attorney, Agent, or Firm*—Foley & Lardner LLP

(57) ABSTRACT

To provide an electron beam system capable of performing three-dimensional measurement of a sample with high precision irrespective of the tilt angle and height of the sample. The electron beam system has a correction factor storing section 32 for storing a correction factor at a reference tilt angle with respect to a plane which is used to tilt a sample by a sample tilting section 5, an approximate coordinate measuring section 28 for obtaining an approximate shape or approximate coordinate values of the sample based on an output corresponding to a stereo image from an electron beam detecting section 4, an image correcting section 30 for correcting the stereo image according to the tilt angle created by the sample tilting section 5 based on the shape or coordinate values of the sample obtained in the approximate coordinate measuring section 28 using a correction factor stored in the correction factor storing section 32, and a precise coordinate measuring section 34 for obtaining a shape or coordinate values of the sample which are more precise than those obtained in the approximate coordinate measuring section 28 based on a corrected stereo image obtained in the image correcting section 30.

10 Claims, 30 Drawing Sheets

U.S. PATENT DOCUMENTS

2004/0264764 A1    12/2004  Kochi et al.
2005/0040332 A1*   2/2005   Kochi et al. ................ 250/310

FOREIGN PATENT DOCUMENTS

JP        2002-270127 A     9/2002
JP        2002-351844 A     12/2002

* cited by examiner

FIG. 3
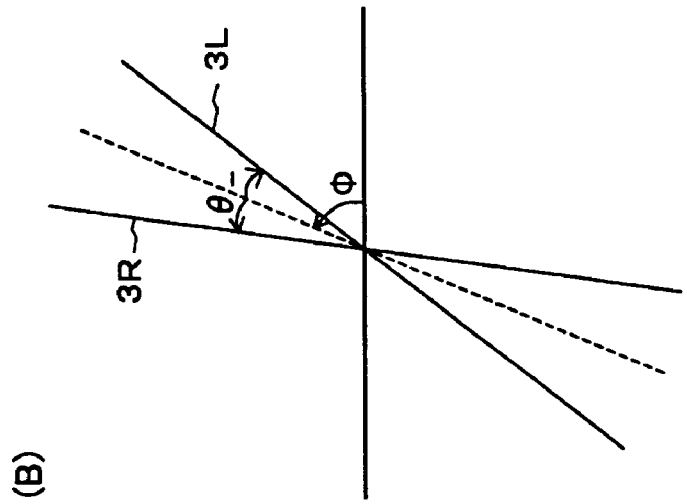
(B)
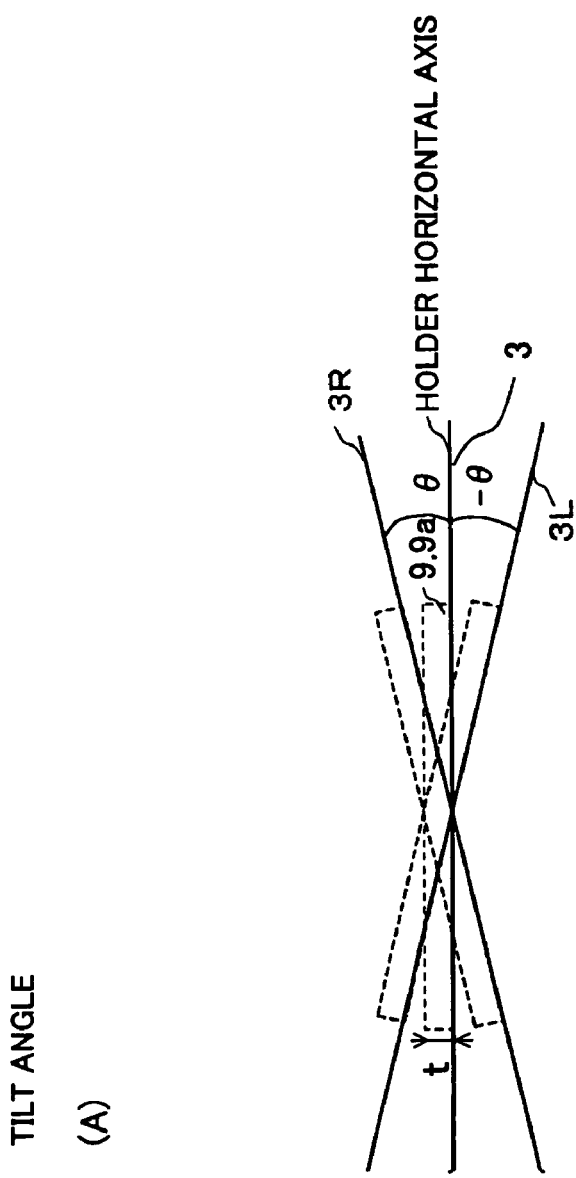
TILT ANGLE
(A)

SAMPLE TILT

IN CASE WHERE IMAGES ARE PHOTOGRAPHED FROM ANGLES ON BOTH SIDES OF Z-AXIS

IN CASE WHERE TILT AXIS IS INCLINED.

ELECTRON BEAM SYSTEM AND ELECTRON BEAM MEASURING AND OBSERVING METHODS

The present application is a divisional of U.S. application Ser. No. 10/897,434, filed Jul. 23, 2004 now U.S. Pat. No. 7,151,258, the entire contents of which are incorporated herein by reference.

BACKGROUND OF THE INVENTION

1. Technical Field

This invention relates to an electron beam system and an electron beam measuring and observing methods for performing three-dimensional measurement or three-dimensional observation of a sample with high precision using images of the sample photographed with an electron microscope.

2. Related Art

In the case of a transmission electron microscope (TEM), the sample is tilted to obtain transmission images at different tilt angles, and stereo observation is performed using the images as right and left images. In the case of a scanning electron microscope (SEM), the sample or the electron beam is tilted to obtain reflection images at different tilt angles, and stereo observation is performed using the images as right and left images as described in Non-Patent Document 1. In the field of semiconductor producing equipment, an electron beam device and a data processing device for an electron beam device are proposed which are capable of appropriately processing stereo detection data obtained from an electron microscope to permit precise three-dimensional observation of an image of a sample and performing three-dimensional shape measurement of the sample based on the observation as disclosed in Patent Documents 1 and 2.

In measuring a sample such as a semiconductor chip or a silicone wafer, however, electron beam distortion or magnification distortion derived from the tilt angle and height of the sample is involved. When electron beam distortion or magnification distortion in the direction in which the sample image is measured is involved, the accuracy in performing image measurement of the sample varies. In fine processing of semiconductor in recent years, the width of the patterns formed on a chip is as small as in the order of submicron, and the margin of dimensional error acceptable in three-dimensional shape measurement is extremely small as compared in the past.

When a measuring object is photographed with a microscope, it is preferred to photograph an area of it where a failure is likely to occur in semiconductor fine processing or to photograph it from an angle suitable for production process management. However, when a measuring object is photographed from many angles, it takes long to complete the photographing and the throughput of semiconductor fine processing is decreased. If an image of a measuring object photographed in an attitude can be converted into an image in a standard attitude suitable for product management and process control and if the image processing for the conversion takes shorter time than photographing the measuring object from many angles, the throughput of semiconductor fine processing is not decreased.

This invention is made to solve the above problem, and it is, therefore, an object of this invention to provide an electron beam system and an electron beam measuring and observing methods by which three-dimensional measurement and observation of a sample can be performed with high precision irrespective of the tilt angle or the height of the sample.

Another object of this invention is to provide an electron beam system and an electron beam measuring method by which three-dimensional measurement of a sample can be performed with high precision irrespective of the tilt angle or the height of the sample and by which an image of a sample photographed in an attitude can be converted into an image photographed in another attitude suitable for the purpose of use.

SUMMARY OF THE INVENTION

An electron beam system of this invention to accomplish the above object is, as shown e.g. in FIG. 1 or FIG. 21, an electron beam system 20 which is connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam emitted from the sample 9 and which is constituted as follows. That is, the electron beam system comprises a correction factor storing section 32 for storing a correction factor at a reference tilt angle with respect to a plane which is used to tilt the sample 9 by the sample tilting section 5; an approximate coordinate measuring section 28 for obtaining an approximate shape or approximate coordinate values of the sample 9 based on an output corresponding to a stereo image from the electron beam detecting section 4; an image correcting section 30 for correcting the stereo image according to a tilt angle created by the sample tilting section 5 based on the shape or coordinate values of the sample obtained in the approximate coordinate measuring section 28 using the correction factor stored in the correction factor storing section 32; and a precise coordinate measuring section 34 for obtaining a shape or coordinate values of the sample 9 which are more precise than those obtained in the approximate coordinate measuring section 28 based on a corrected stereo image corrected in the image correcting section 30.

In an apparatus as constituted as described above, the correction factor storing section 32 stores a correction factor at a reference tilt angle with respect to a plane which is used to tilt the sample 9 by the sample tilting section 5. The correction factor is acquired using a reference template 9a, for example, instead of the sample 9. The approximate coordinate measuring section 28 obtains an approximate shape or approximate coordinate values of the sample 9 based on an output corresponding to a stereo image from the electron beam detecting section 4. The image correcting section 30 corrects the stereo image according to the tilt angle created by the sample tilting section 5 based on the shape or coordinate values of the sample obtained in the approximate coordinate measuring section 28 using a correction factor stored in the correction factor storing section 32. The precise coordinate measuring section 34 obtains a shape or coordinate values of the sample 9 which are more precise than those obtained in the approximate coordinate measuring section 28 based on a corrected stereo image corrected in the image correcting section 30.

An electron beam system of this invention to accomplish the above object is, as shown e.g. in FIG. 1 or FIG. 21, an electron beam system 20 which is connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam emitted from the sample 9 and which is constituted as follows. That is, the electron beam system comprises a correction factor storing section 32 for storing a correction factor at a reference tilt angle with respect to a plane which is used to tilt the sample 9 by the sample tilting section 5; an image correcting section 30 for correcting the stereo image according to a tilt angle created by the sample tilting section 5 based on a given approximate shape or given coordinate values of the sample 9 using the correction factor stored in the correction factor storing section 32; and a precise coordinate measuring section 34 for obtaining the shape or coordinate values of the sample 9 based on a corrected stereo image corrected in the image correcting section 30.

Here, the external information such as the design data of the sample may be given to the image correcting section as the approximate shape or coordinate values of the sample instead of the data from the approximate coordinate measuring section in an electron beam measuring device as an electron beam system.

An electron beam system of this invention to accomplish the above object is, as shown e.g. in FIG. 1 or FIG. 21, an electron beam system which comprises an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam emitted from the sample 9 and which is constituted as follows. That is, the electron beam system comprises a correction factor storing section 32 for storing a correction factor at a reference tilt angle with respect to a plane which is used to tilt the sample 9 by the sample tilting section 5; an approximate coordinate measuring section 28 for obtaining an approximate shape or approximate coordinate values of the sample 9 based on an output corresponding to a stereo image from the electron beam detecting section 4; and an image correcting section 30 for correcting the stereo image according to a tilt angle created by the sample tilting section 5 based on the shape or coordinate values of the sample 9 obtained in the approximate coordinate measuring section 28 using the correction factor stored in the correction factor storing section 32. Here, the electron beam system can be referred to as an electron beam observing system for observing a sample using an electron beam.

Preferably in the electron beam system, the sample tilting section 5 relatively tilts the sample holder 3 and the electron beam 7 (the angle between the sample holder 3 and the electron bean is changed) by at least one of the two ways of a first tilt angle changing way in which the irradiating direction of electron beam in the electron optical system is changed with respect to the sample and a second tilt angle changing way in which the sample holder 3 is tilted with respect to the electron beam 7 as shown e.g. in FIG. 1 and FIG. 21. That is, the sample holder 3 and the electron beam 7 are tilted relative to each other, regardless which one is tilted or whether both of them are tilted.

Preferably in the electron beam system, the correction factor stored in the correction factor storing section 32 is obtained by, as shown e.g. in FIG. 10: placing a reference template 9a having characteristic points the shape or coordinate values of which have been known in advance on the sample holder 3 (S200); acquiring a stereo image of the sample 9 with the sample holder 3 and the electron beam 7 relatively tilted by the sample tilting section 5 (S210 and S220); and comparing the shape or coordinate values of the reference template 9a measured based on the stereo image with the shape or coordinate values of the characteristic points in a correction factor calculating section 38 (S240).

Preferably in the electron beam system, the correction factor stored in the correction factor storing section 32 is obtained by a way comprising, as shown e.g. in FIG. 10: placing a reference template 9a having characteristic points the shape or coordinate values of which have been known in advance on the sample holder 3 (S200); acquiring a stereo image of the sample 9 with the sample holder 3 and the electron beam 7 relatively tilted and slid by the sample tilting section 5 (S210 and S220); and comparing the shape or coordinate values of the reference template 9a measured based on the stereo image with the shape or coordinate values of the characteristic points in a correction factor calculating section 38 (S240).

Preferably in the electron beam system, the characteristic points on the reference template 9a are associated with at least two heights as shown e.g. in FIG. 9. Preferably, as shown e.g. in FIG. 1 or FIG. 21, a lens distortion correcting parameter acquiring section 36 acquires a lens distortion correcting parameter for use in correcting the lens distortion of the electron optical system, and the image correcting section 30 corrects a lens distortion included in detection data at a plurality of tilt angles using the lens distortion correcting parameter.

Preferably in the electron beam system, the reference template 9a is constituted of a two-dimensional chart as shown e.g. in FIG. 4. Preferably, as shown e.g. in FIG. 1 and FIG. 21, the reference template 9a can be tilted at another tilt angle in addition to the angles at which the sample tilting section 5 relatively tilts the sample holder 3 and the electron beam 7 so that a stereo image can be acquired, the electron beam detecting section 4 acquires a stereo image of the sample 9 at the tilt angle, and the correction factor calculating section 38 calculates a correction factor to be stored in the correction factor storing section 32 based on the stereo image.

An electron beam measuring method of this invention to accomplish the above object is, as shown e.g. in FIG. 1, FIG. 10 and FIG. 14, an electron beam measuring method for measuring the shape of a sample 9 using an electron beam system 20 connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam emitted from the sample 9, and comprises the following steps typically to be performed by a computer. The steps are: a storing step of storing a correction factor at a reference angle in a correction factor storing section 32 (S240 in FIG. 10); a first data detecting step in which the electron beam detecting section 4 detects first detection data when the sample holder 3 and the electron beam 7 form a first tilt angle with respect to each other (S310 in FIG. 14); a second data detecting step in which the electron beam detecting section 4 detects second detection data when the sample holder 3 and the electron beam 7 form a second tilt angle with respect to each other (S310 in FIG. 14); an approximate measurement step for obtaining an approximate shape or approximate coordinate values of the sample 9 based on the detection data obtained in the first and second data detecting steps (S320 in FIG. 14); an image correcting step of reading out a corresponding correction factor from the correction factor storing section 32 and correcting an image based on the shape or coordinate values of the sample 9 obtained in the approximate measurement step (S330 in FIG. 14); and a precise measurement step of obtaining the shape or coordinate values of the sample 9 based on the corrected stereo image obtained in the image correcting step (S350 in FIG. 14).

Here, the storing step may be a step of storing a correction factor at a reference angle with respect to a plane which is used to tilt the sample by the sample tilting section 5 and stored in advance in a correction factor storing section 32.

An electron beam observing method of this invention to accomplish the above object is, as shown e.g. in FIG. 1, FIG. 10 or FIG. 20, an electron beam observing method for observing the shape of a sample 9 using an electron beam system 20 connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam emitted from the sample 9, and has the following steps typically to be performed by a computer. The steps are: a storing step of storing a correction factor at a reference angle in a correction factor storing section 32 (S240 in FIG. 10); an approximate measurement step of obtaining an approximate shape or approximate coordinate values of the sample based on an output corresponding to an image produced in the electron beam detecting section 4 (S540 in FIG. 20); an image correcting step of reading out a corresponding correction factor from the correction factor storing section 32 and correcting the image based on the shape or coordinate values of the sample 9 obtained in the approximate measurement step (S550 in FIG. 20); and an image displaying step of displaying the image corrected in the image correcting step (S560 in FIG. 20).

An electron beam system of this invention to accomplish the above object is, as shown e.g. in FIG. 22 and FIG. 30, an electron beam system 20a which is connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam 7 emitted from the sample 9 and which is constituted as follows. That is, the electron beam system comprises a reference image selecting section 40 for selecting one of and left images for a stereo image obtained from the electron beam detecting section 4, as a reference image; a first correction factor measuring section 44 for obtaining a first image correction factor which distorts the non-reference image into the distortion state of the reference image using the correspondence between the right and left images; a first image converting section 46 for converting the non-reference image using the first image correction factor obtained in the first correction factor measuring section 44; an image coordinate transforming section 48 for performing a coordinate transformation of the reference image and an image converted from the non-reference image in the image converting section 46 to images which can be obtained when the relative tilt angle created by the sample tilting section 5 is in a standard state; and a coordinate measuring section 52 for obtaining the shape or coordinate values of the sample included in a stereo image composed of the reference image and the non-reference image which have been subjected to a coordinate transformation in the image coordinate transforming section 48.

In an electron beam system, as shown in FIG. 23, for example, the reference image selecting section 40 selects one of the right and left images for a stereo image obtained from the electron beam detecting section 4 as a reference image. As the photographing object, a sample having reference points the positions of which have been known in advance such as a reference target. As the photographing attitude, tilt states suitable to photograph the sample are selected. The first correction factor measuring section 44 obtains a first image correction factor which distorts the non-reference image into the distortion state of the reference image. As the photographing object, a reference target is used. The first image converting section 46 converts the non-reference image using the first image correction factor into an image having distortion similar to that of the reference image. As the photographing object, a sample as a measuring object is used. The image coordinate transforming section 48 performs a coordinate transformation of the reference image and an image converted from the non-reference image to images which can be obtained when the relative tilt angle created by the sample tilting section 5 is in a standard state (for example the state of 0 degree tilt angle of the holder 3 with the electron beam 7 perpendicular to the holder). Since image distortion is not corrected in the coordinate transformation, the image processing in the coordinate distortion is easier that that in the image conversion. Also, since coordinate conversion into images which can be obtained in a standard state is performed, images of the sample photographed in tilt states can be used easily. The coordinate measuring section 52 obtains the shape or coordinate values of the sample included in a stereo image composed from the non-reference image and reference image which have been subjected to a coordinate transformation in the image coordinate transforming section 48.

Preferably, the electron beam system of this invention also comprises, as shown e.g. in FIG. 22, a second image converting section 54 for converting the reference image and the non-reference image which have been subjected to a coordinate transformation in the image coordinate transforming section 48, using a second image correction factor for removing the distortion in the reference image with respect to an image which can be obtained when the relative tilt angle created by the sample tilting section 5 is in a standard state, and the coordinate measuring section 52 obtains the shape or coordinate values of the sample included in a stereo image composed of images converted from the reference image and the non-reference image in the second image converting section 54. Since the distortion in images photographed in tilt states suitable to photograph the sample and the distortion in an image photographed when the relative tilt angle created by the sample tilting section 5 is in a standard state are different from each other in the electron beam device 10, when an image obtained when the relative tilt angle created by the sample tilting section 5 is in a standard state is corrected using the first image correction factor obtained in the first correction factor measuring section 44, image distortion may not be sufficiently corrected. When the second image converting section 54 corrects the non-reference image and the reference image which have been subjected to a coordinate transformation in the image coordinate transforming section 48, using the second image correction factor, the coordinate measuring section can accurately obtain the shape or coordinate values of the sample.

Preferably, the electron beam system of this invention also comprises, as shown e.g. in FIG. 30, a third image converting section 55 for converting the reference image and an image converted from the non-reference image in the first image converting section 46 using a third image correction factor for removing image distortion in the reference image with respect to an image which can be obtained when the relative tilt angle created by the sample tilting section is in a standard state, and the image coordinate transforming section 48 performs a coordinate transformation of images converted from the reference image and the non-reference image in the third image converting section 55 into images which can be obtained when the relative tilt angle created by the sample tilting section 5 is in a standard state. Since the distortion in images photographed in tilt states suitable to photograph the sample and the distortion in an image photographed when the relative tilt angle created by the sample tilting section 5 is in a standard state are different from each other in the electron beam device 10, when an image obtained when the relative tilt angle created by the sample tilting section 5 is in a standard state is corrected using first image correction factor obtained in the first correction factor measuring section 44, image distortion may not be sufficiently corrected. When the third image converting section 55 corrects, using the third image correction factor, the reference image and an image converted from the non-reference image in the first image converting section 46, and when the image coordinate transforming section 48 performs a coordinate transformation of the images converted from the reference image and non-reference image in the third image converting section 55 into images which can be obtained when the relative tilt angle created by the sample tilting section 5 is in a standard state, the coordinate measuring section can accurately obtain the shape or coordinate values of the sample.

An electron beam system of this invention to accomplish the above object is, as shown e.g. in FIG. 26, an electron beam system 20b which is connected to an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam 7 emitted from the sample 9 and which is constituted as follows. The electron beam system comprises a reference image storing section 60 for storing an image of a reference template obtained when the relative tilt angle created by the sample tilting section 5 is in a standard state, as a reference image; a tilt reference image storing section 64 for photographing the reference template at sample photographing tilt angles created by the sample tilting section 5 with the electron beam detecting section 4 to acquire tilt reference images; a reference image mapping and converting section 62 for mapping the reference image stored in the reference image storing section 60 into images at the sample photographing tilt angles; a correction factor measuring section 66 for comparing the images mapped from the reference image in the reference image mapping and converting section 62 with the reference template images stored in the tilt reference image storing section 64 to obtain an image correction factor for removing the distortion in the reference template image; a tilted sample image acquiring section 68 for photographing and acquiring images of a sample at the sample photographing tilt angles created by the sample tilting section 5 with the electron beam detecting section 4; an image converting section 70 for converting the images of the sample photographed at the sample photographing tilt angles using the image correction factor obtained in the correction factor measuring section 66; and a coordinate measuring section 72 for obtaining the shape or coordinate values of the sample included in a stereo image composed of the images of the sample converted in the image converting section 70.

In an electron beam system constituted as described above, as shown e.g. in FIG. 27, an image of the reference template obtained when the relative tilt angle created by the sample tilting section 5 is in a standard state as a reference image is stored in the reference image storing section 60, and images of the reference template at sample photographing tilt angles created by the sample tilting section 5 are stored in the tilt reference image storing section 64. The reference image mapping and converting section 62 maps the reference image stored in the reference image storing section 60 into images at the sample photographing tilt angles. The correction factor measuring section 66 compares the images mapped from the reference image in the reference image mapping and converting section 62 with the reference template image stored in the tilt reference image storing section 64 to obtain an image correction factor for removing the distortion in the reference template image. The tilted sample image acquiring section 68 acquires images of a sample photographed at the sample photographing tilt angles created by the sample tilting section 5. The image converting section 70 converts the images of the sample photographed at the sample photographing tilt angles using the image correction factor obtained in the correction factor measuring section 66. The coordinate measuring section 72 obtains the shape or coordinate values of the sample included in a stereo image composed of the images of the sample converted in the image converting section 70.

Preferably in the electron beam system, the sample tilting section 5 relatively tilts the sample holder 3 and the electron beam 7 by at least one of the two ways of a first tilt angle changing way in which the direction in which the electron optical system 2 irradiates electron beam 7 is changed with respect to the sample and a second tilt angle changing way in which the sample holder 3 is tilted with respect to the electron beam 7. When a stereo pair images are acquired in the electron beam device 10, the direction in which the electron optical system 2 irradiates the electron beam 7 may be changed with respect to the sample or the sample holder 3 may be tilted with respect to the electron beam 7 in order to acquire right and left images with parallax.

Preferably in the electron beam system of this invention, the correction factor is obtained in the correction factor measuring section 66 by a way having the steps of: placing a reference template having characteristic points of which the shape or coordinate values have been known in advance on the sample holder 3; relatively tilting the sample holder 3 and the electron beam 7 with the sample tilting section 5; acquiring a stereo image of the reference template with the electron beam detecting device 4; and comparing the characteristic points on the reference template and the shape and coordinate values of the characteristic points on the reference template measured based on the stereo image with the coordinate measuring section 72.

Preferably in the electron beam system of this invention, the reference template has reference marks associated with at least two heights, the first correction factor measuring section 44 or the correcting factor measuring section 66 acquires a lens distortion correcting parameter for use in correcting the lens distortion of the electron optical system, and the first image converting section 46 or the image converting section 70 corrects lens distortion included in detected data at a plurality of tilt angles, using the lens distortion correcting parameter.

Preferably in the electron beam system of this invention, the reference template is constituted of a two-dimensional chart, the reference template is held at a first tilt angle created by relatively tilting the sample holder 3 and the electron beam 7 to acquire a stereo image, with the sample tilting section 5, and the reference template is also held at a second tilt angle (tilt state) different from the first tilt angle; the electron beam detecting section 4 acquires images of the reference template in the first tilt angle and the second tilt angle; and the first correction factor measuring section 44 or the correction factor measuring section 66 obtains an image correcting factor based on the images of the reference template in the first tilt angle and second tilt angle.

An electron beam measuring method of this invention to accomplish the above object is, as shown e.g. in FIG. 22, an electron beam measuring method for measuring the shape of a sample 9 using an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam 7 emitted from the sample 9, and comprises the following steps. The steps are, as shown e.g. in FIG. 24 and FIG. 25: a reference image selecting step of selecting, as a reference image, one of right and left images for a stereo image obtained from the electron beam detecting section 4 (S612 in FIG. 24); a first correction factor measuring step of obtaining a first image correction factor which distorts a non-reference image into a distortion state of the reference image, using the correspondence between the right and left images (S616 in FIG. 24); a first image converting step of converting the non-reference image using the first image correction factor (S712 in FIG. 25); an image coordinate transforming step of performing coordinate transformation of the reference image and an image converted from the non-reference image in the first image converting section 46 into images which can be obtained when the relative tilt angle created by the sample tilting section 5 is in a standard state (S714 in FIG. 25); and a coordinate measuring step of obtaining the shape or coordinate values of the sample included in a stereo image composed of the reference image and the non-reference image which have been subjected to a coordinate transformation in the image coordinate transforming section 48 (S716 and S718 in FIG. 25). Here, the non-reference image is the other image of the right and left images than the selected image as a reference image in the reference image selecting step.

An electron beam measuring method of this invention to accomplish the above object is, as shown e.g. in FIG. 26, an electron beam measuring method for measuring a shape of a sample using an electron beam device 10 having an electron optical system 2 for irradiating an electron beam 7 emitted from an electron beam source 1 on a sample 9; a sample holder 3 for holding the sample 9; a sample tilting section 5 for relatively tilting the sample holder 3 and the electron beam 7 so that a stereo image of the sample 9 can be acquired; and an electron beam detecting section 4 for detecting an electron beam 7 emitted from the sample 9, and has the following steps. The steps are, as shown e.g. in FIG. 28 and FIG. 29: a reference image storing step of storing an image of a reference template obtained when the relative tilt angle created by the sample tilting section 5 is in a standard state, as a reference image (S804 and S806 in FIG. 28); a tilt reference image storing step of photographing the reference template at sample photographing tilt angles created by the sample tilting section with the electron beam detecting section 4 to acquire tilt reference images (S808 and S810 in FIG. 28); a reference image mapping and converting step of mapping the stored reference image to images at the sample photographing tilt angles (S812 in FIG. 28); a correction factor measuring step of comparing images mapped from the reference image with the reference template image stored in the tilt reference image storing step to obtain a image correction factor for removing image distortion in the reference template image (S814 in FIG. 28); a tilted sample image acquiring step of photographing and acquiring images of the sample at the sample photographing tilt angle created by the sample tilting section 5 with the electron beam detecting section 4 (S904 and S906 in FIG. 29); an image converting step of converting the images of the sample at the sample photographing tilt angles using the image correction factor obtained in the correction factor measuring step (S910 in FIG. 29); and a coordinate measuring step of obtaining the shape or coordinate values of the sample included in a stereo image composed of the images of the sample converted in the image converting step (S912 and S914 in FIG. 29).

In the electron beam system and the method of the first invention, the image correcting section corrects a stereo image according to the tilt angle created by the sample tilting section based on an approximate shape or approximate coordinate values of a sample using a correction factor at a reference tilt angle with respect to a plane which is used to tilt the sample by the sample tilting section, the correction factor being stored in a correction factor storing section. Thus, three-dimensional measurement of a sample can be performed with high precision irrespective of the tilt angle or the height of the sample.

In the electron beam system and the method of the second invention, the image correcting section corrects a stereo image according to the tilt angle created by the sample tilting section based on an approximate shape or approximate coordinate values of a sample obtained in an approximate coordinate measuring section using a correction factor at a reference tilt angle with respect to a plane which is used to tilt the sample by the sample tilting section, the correction factor being stored in a correction factor storing section. Thus, three-dimensional observation of a sample can be performed with high precision irrespective of the tilt angle or the height of the sample.

In the electron beam system of the third invention, the first image converting section corrects a stereo image according to the tilt angle created by a sample tilting section using a first image correction factor which distorts a non-reference image into a distortion state of a reference image. Since a stereo pair images of a sample in tilt states suitable to be photographed are acquired and three-dimensional measurement (stereo matching) is performed according to image distortion in one of the right and left image of the stereo pair images, three-dimensional measurement of a sample can be performed with high precision irrespective of the tilt angle or the height of the sample.

In the electron beam system of the fourth invention, the correction factor measuring section compares images mapped from the reference image in a reference image mapping and converting section with a reference template image stored in a tilt reference template image storing section and corrects a stereo image according the tilt angle created by the sample tilting section using an image correction factor for removing image distortion in the reference template image. Thus, three-dimensional observation of a sample can be performed with high precision irrespective of the tilt angle or the height of the sample.

According to the embodiments of this invention, a stereo image of a sample photographed at an angle can be converted in a stereo image which can be photographed in another attitude suitable for the purpose of use. Thus, this invention is suitably applied to stereo image measurement such as process control and product management.

The basic Japanese Patent Application No. 2003-279386 filed on Jul. 24, 2003 and No. 2003-305191 filed on Aug. 28, 2003 are hereby incorporated in its entirety by reference into the present application.

The present invention will become more fully understood from the detailed description given hereinbelow. However, the detailed description and the specific embodiment are illustrated of desired embodiments of the present invention and are described only for the purpose of explanation. Various changes and modifications will be apparent to those ordinary skilled in the art on the basis of the detailed description.

The applicant has no intention to give to public any disclosed embodiment. Among the disclosed changes and modifications, those which may not literally fall within the scope of the patent claims constitute, therefore, a part of the present invention in the sense of doctrine of equivalents.

BRIEF DESCRIPTION OF THE DRAWINGS

FIG. 3 is an explanatory view of the tilt states of a sample holder of an electron beam measuring device;

DETAILED DESCRIPTION OF THE PREFERRED EMBODIMENT

[Principle]

Figure 2:
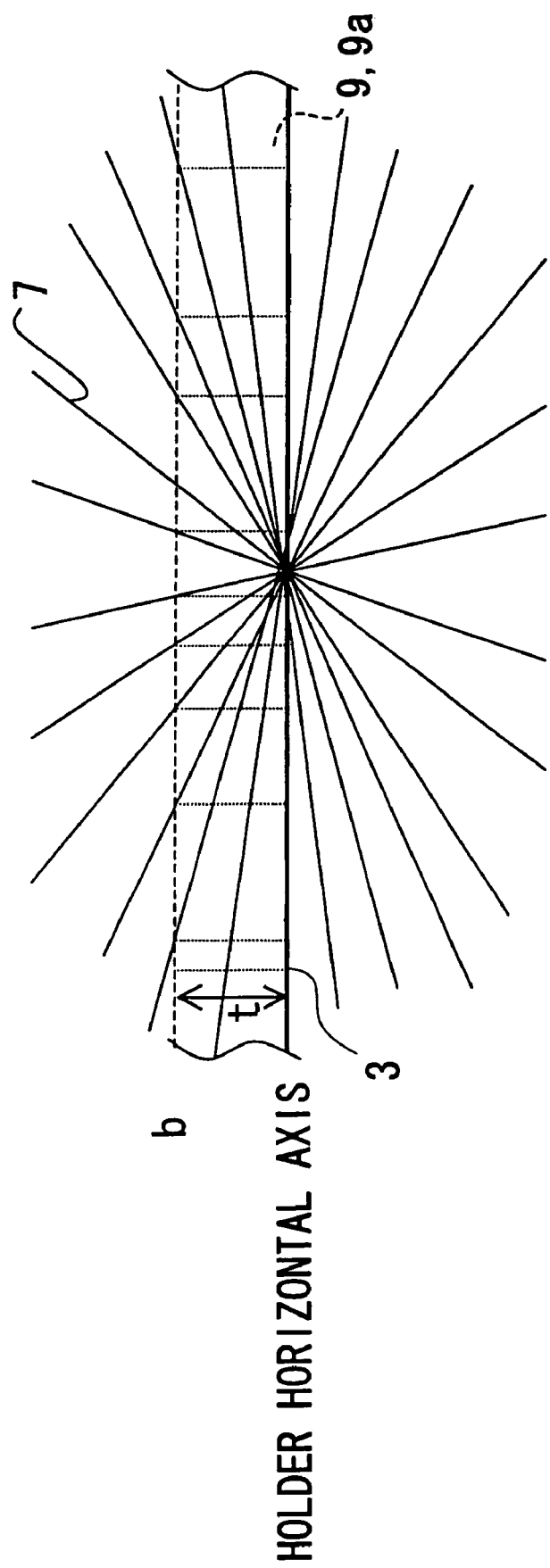
FIG. 2 is an explanatory view of the relative angle of an electron beam incident on a sample or reference template in an electron beam device.

Description will be hereinafter made of the principle of this invention with reference to the drawings. FIG. 2 and FIG. 3 are explanatory views of the relative angle of an electron beam incident on a sample 9 or a reference template 9a in an electron beam device. As shown in FIG. 2 or FIG. 3, the incident angle of an electron beam 7 on the reference template 9a is relatively adjusted and images of the reference template 9a are acquired at different incident angles with an electron beam measuring device 20. The reference template 9a will be described later with reference to FIG. 4.

As shown in FIG. 2, when a sample holder 3 is tilted at an arbitrary angle, a holder horizontal axis is coincident with the axis of rotation of the sample holder 3. When the electron beam 7 is tilted, a tilt center axis including a reference point on the sample holder 3 is set at a horizontal axis. A horizontal broken line b that is apart by a thickness t from the horizontal axis represents a surface of the reference template 9a placed on the sample holder 3. The thickness of the reference template 9a is represented by t.

FIG. 3, which is similar to FIG. 2, is an explanatory view of the tilt states of a sample holder of an electron beam system. In FIG. 3, (A) shows a case in which a tilt state is achieved from a horizontal state as a standard state and (B) shows a case in which a tilt state is achieved from another tilt state as a standard state. A first tilt state of the sample holder 3 is achieved by tilting it through an angle (±θ) from a horizontal state as a standard state (see FIG. 3(A)), and a second tilt state of the sample holder 3 is achieved by tilting it through an angle (±θ) from a state in which it is tilted at a specific angle Φ as a standard state (see FIG. 3(B)). When the sample holder 3 is in tilt states, the angle between the reference template 9a or the sample 9 placed on the sample holder 3 and an electron beam incident on it is adjusted so that the electron beam system can acquire right and left images of the sample for stereo image measurement.

An electron beam measuring device 20 as the electron beam system acquires the positions of targets in the image of the reference template and a correction factor for removing the distortion in the direction of the height of the reference template at every tilt angle. Then, a sample 9 is placed on the sample holder 3 in place of the reference template, and an image of the sample 9 as a subject is acquired at an arbitrary tilt angle by the electron beam measuring device 20. The electron beam system of this invention may be the electron beam measuring device 20 or have an electron beam device 10 in addition to the electron beam measuring device 20.

Figure 4:
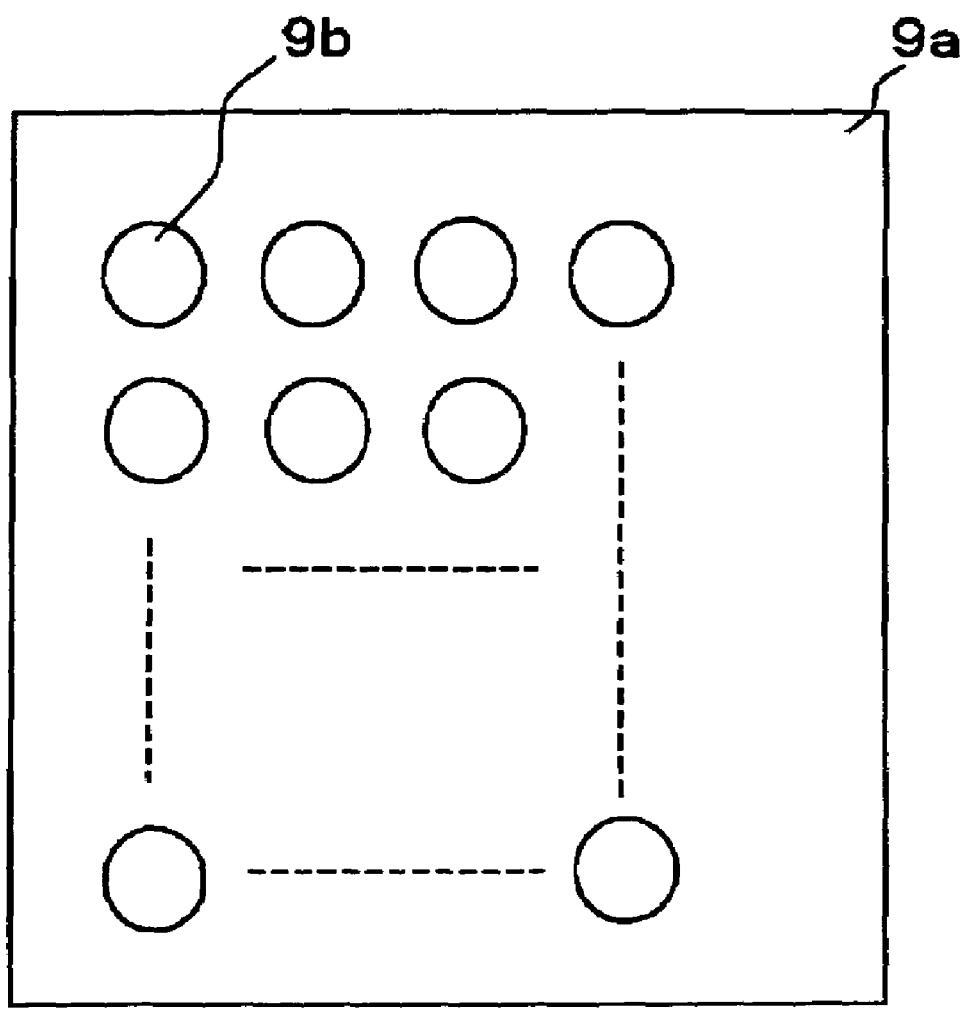
FIG. 4 is a view used to explain the distribution of targets arranged on a two-dimensional reference template.

FIG. 4 is a view used to explain the distribution of targets arranged on a two-dimensional reference template. On a two-dimensional reference template 9a, a plurality of precisely measured targets 9b are arranged. The targets 9b, which are referred to also as measurement reference points or characteristic points, are marks formed on a surface of the reference template 9a in an easily recognizable manner. The reference template 9a is placed on the sample holder 3 of the electron beam device 10 (see FIG. 1) and becomes horizontal or tilted. Using information on the positions of the targets on the reference template 9a, a distortion factor of the targets on the reference template 9a at each tilt angle can be acquired.

That is, the electron beam measuring device 20 can correct the images of the sample 9 based on approximate height and position of the sample 9. The tilt angle of the reference template 9a used for correction of the electron beam device 20 can be obtained from the approximate height and position of the subject (sample 9), and image distortion in every part of the subject at the tilt angle can be calculated based on the image distortion pattern at the tilt angle. Image distortion at every part of the subject is calculated with respect to the entire portion thereof for each subject, and the image of the sample 9 is corrected to compensate for the image distortion. Alternatively, the image distortion may be calculated as an image distortion pattern at each height (space) of the electron beam measuring device 20 and stored into a memory of the electron beam measuring device 20. That is, using information on the positions of the targets on the reference template 9a as shown in FIG. 4, a distortion factor of the targets on the reference template 9a at each tilt angle can be acquired.

Figure 5:
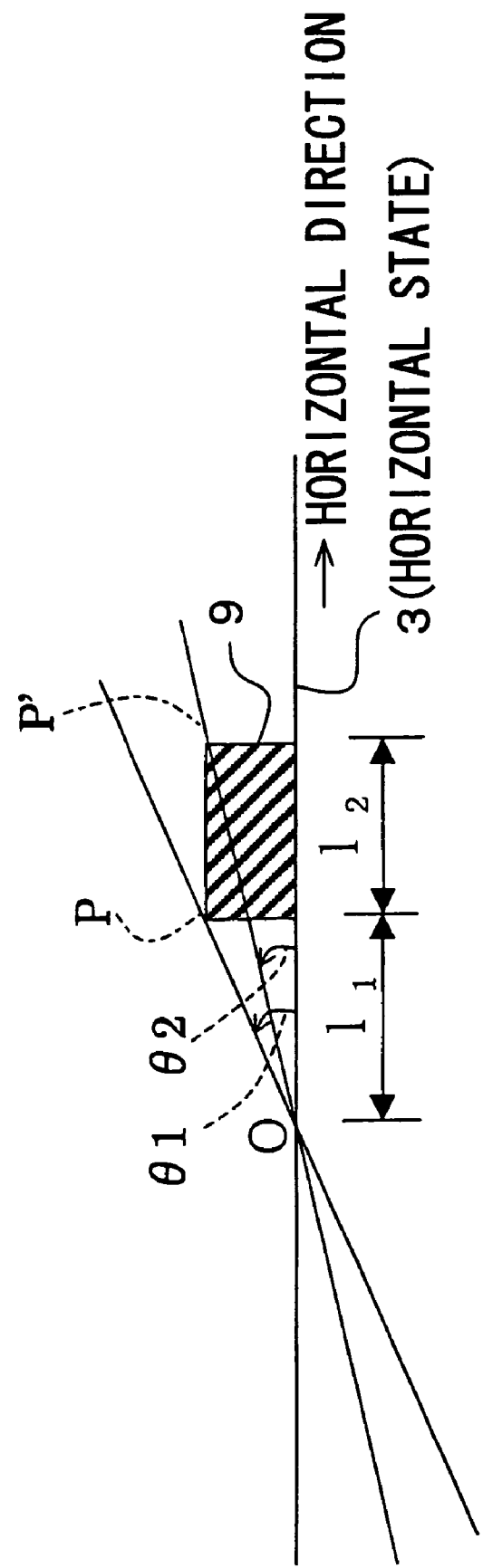
FIG. 5 is a side view used to explain the state in which a subject is placed on a sample holder 3 in a horizontal state.
Figure 6:
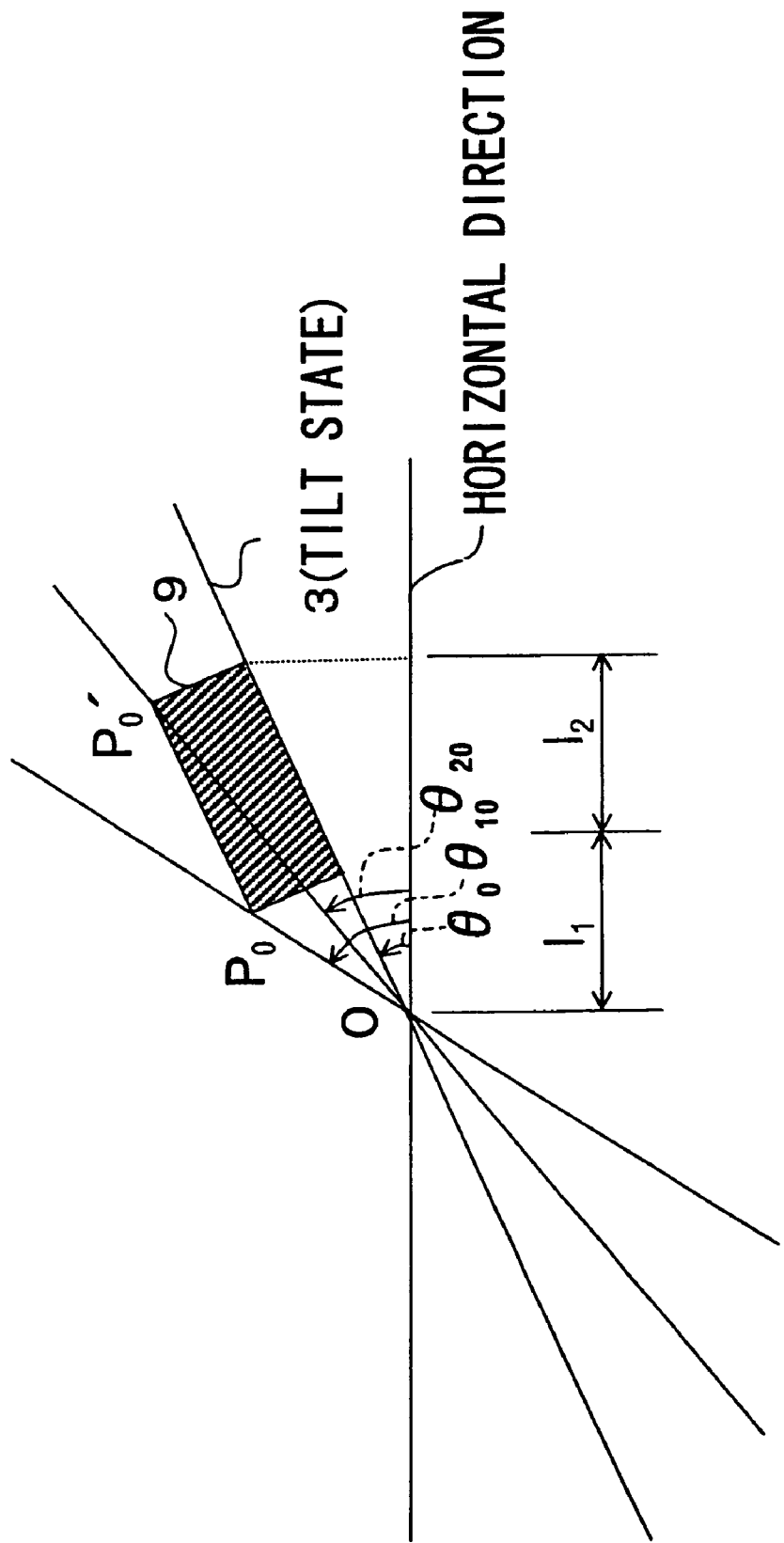
FIG. 6 is a side view used to explain the state in which a subject is placed on a sample holder 3 in a tilt state.

FIG. 5 is a side view used to explain the state in which a subject is placed on the sample holder 3 in a horizontal state, and FIG. 6 is side view used to explain the state in which a subject is placed on the sample holder 3 in a tilt state. As shown in FIG. 5, when approximate position and height (points P and P') of the subject 9 as a measuring object placed on the sample holder 3 can be measured, correction amounts according to the position and height of the sample 9, that is, the tilt angles ($\theta_1$ and $\theta_2$) and the amount of distortion to be corrected at the tilt angles can be obtained.

That is, when the distances from the axis O of rotation of the sample holder 3 to the points P and P' $\{l_1, (l_1+l_2)\}$ and the heights of the points P and P' $\{l_1 \times \tan\theta_1, (l_1+l_2) \times \tan\theta_2\}$ can be measured, correcting tilt angles corresponding to them can be obtained. Then, the image distortion can be calculated from the positions on the tilt angles and corrected.

Although the horizontal angle of the sample holder 3 on which the sample 9 is placed is 0° in the case shown in FIG. 5, even when the axis of the sample holder 3 is tilted at an angle of $\theta_0$ as shown in FIG. 6, the amount of distortion to be corrected can be calculated from the tilt angles ($\theta_{10}$ and $\theta_{20}$) and positions (point $P_0$ and $P_0$') corresponding to the position and height of the sample 9 (FIG. 6). That is, when the sample is mapped to a horizontal position and the coordinates and height thereof are obtained, correction can be made according to the height of the sample 9.

Figure 7A:
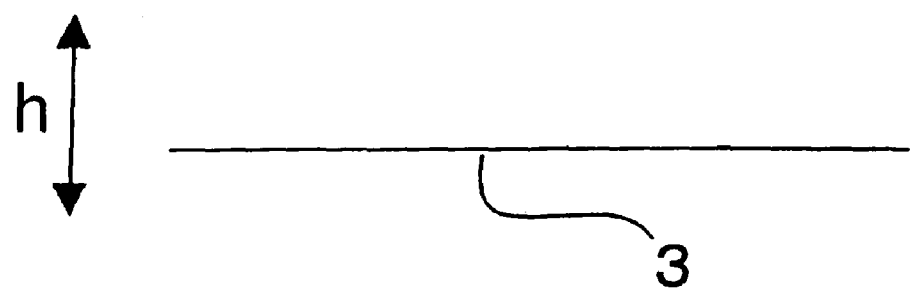
FIGS. 7A and 7B are views used to explain an example of correction of the height h of the sample 9.
Figure 7B:
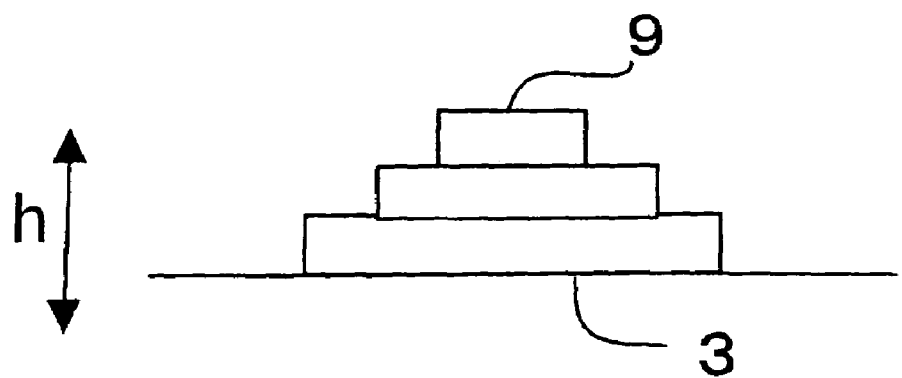

FIG. 7 is a view used to explain an example of correction of the height h of the sample 9. In FIG. 7, (A) shows the sample holder 3 alone and (B) shows the sample holder 3 and the sample 9 placed on the sample holder 3. When the electron beam device 10 is provided with a mechanism for sliding the sample holder 3 vertically, image distortion can be removed by making the height of the sample 9 whose images are to be acquired equal to the height of the reference template 9a.

Figure 8:
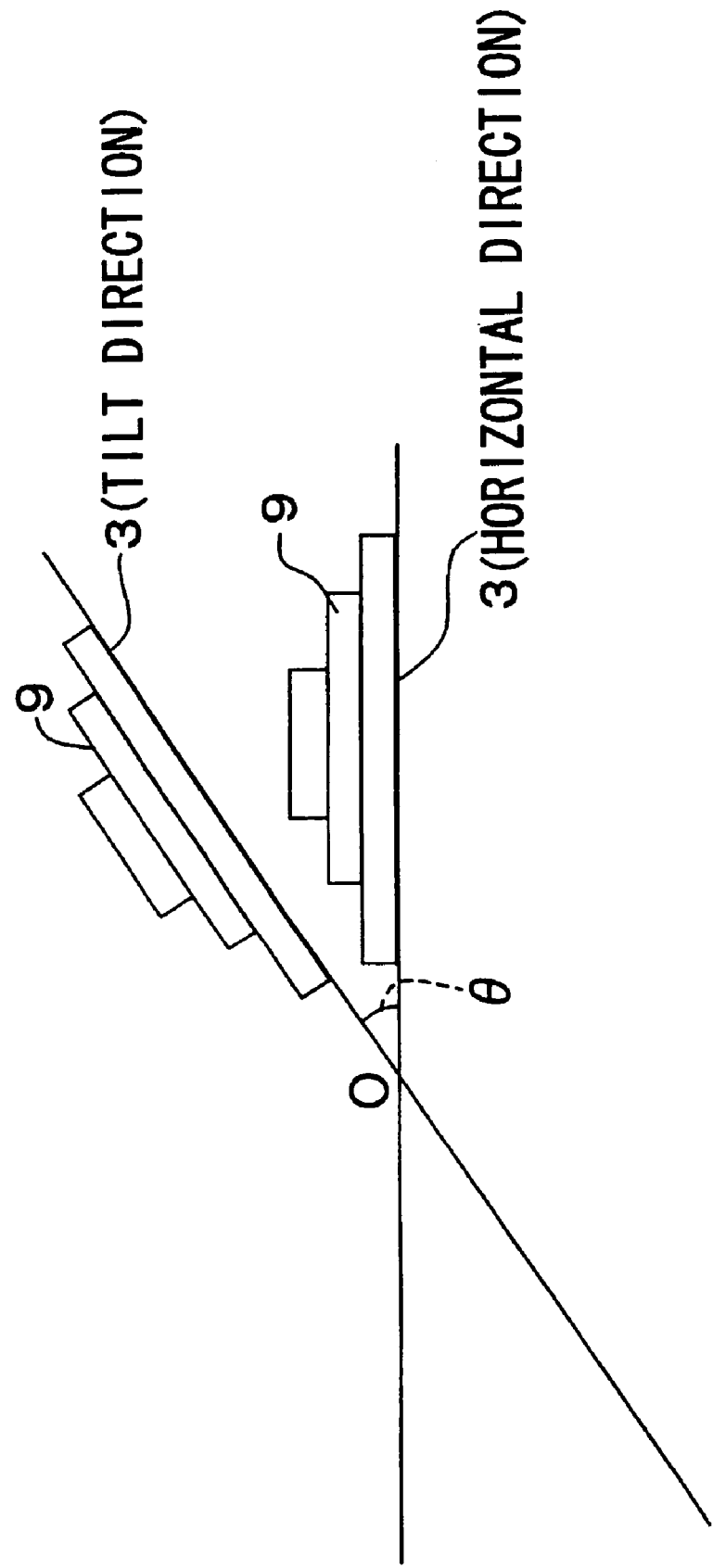
FIG. 8 is a view used to explain another example of correction of the height h of the sample 9.

FIG. 8 is a view used to explain another example of correction of the height h of the sample 9. The height of the sample 9 placed on the sample holder 3 can be corrected at each tilt angle θ. Thus, space correction may be performed at the angle and distortion correction factor at each angle may be stored. In this case, since correction of a space in the direction of each tilt axis can be performed, images may be corrected in this state to perform three-dimensional measurement.

Figure 9:
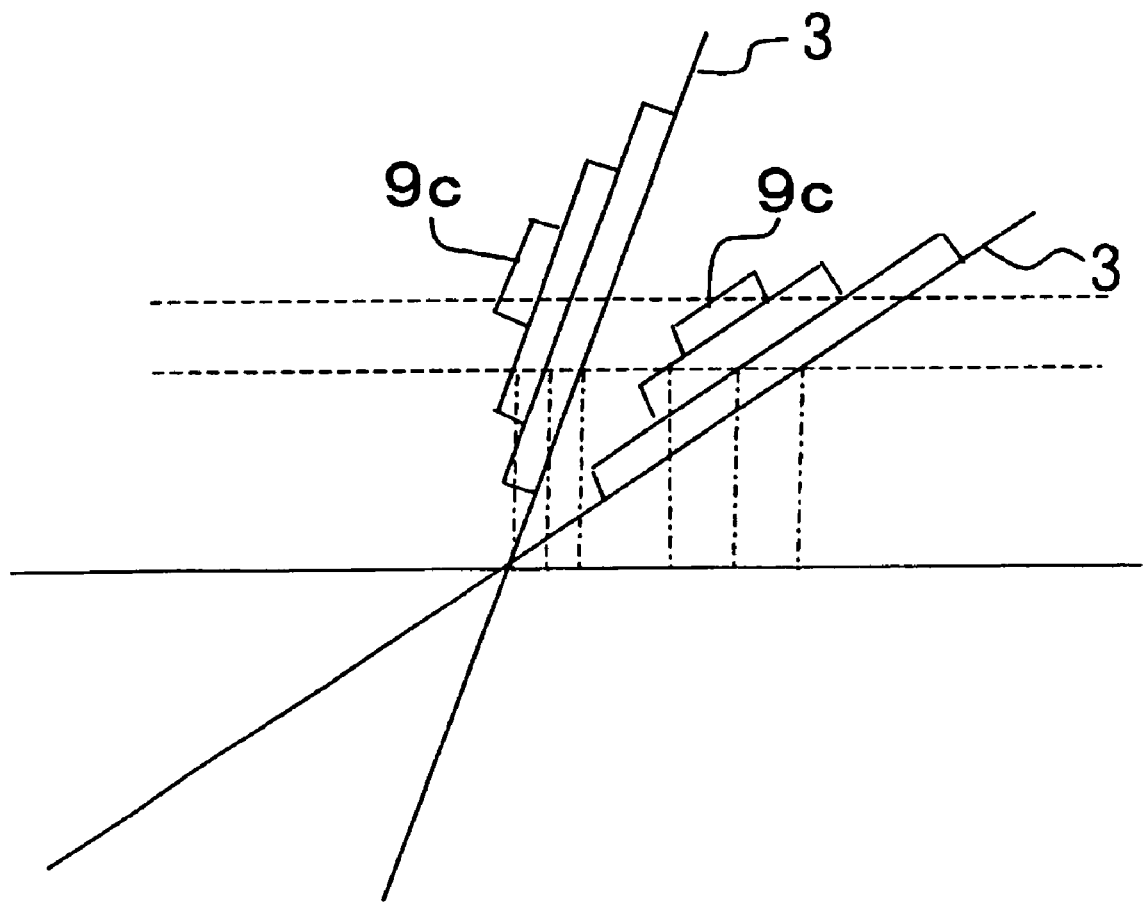
FIG. 9 is a view used to explain another example of correction of the height h of a three-dimensional template 9c placed on a sample holder 3 in a tilt state.

FIG. 9 is a view used to explain another example of correction of the height h of a three-dimensional template 9c placed on a sample holder 3 in a tilt state. When a three-dimensional reference template 9c is placed on the sample holder 3 in a tilt state, the targets on the reference template 9c are at various heights. Thus, even when the sample holder 3 in a tilt state is further tilted, correction of a space in the direction of each tilt axis can be performed with accuracy even if the interval between the tilt angles is large.

FIG. 9 is an explanatory view of a three-dimensional template. Here, the three-dimensional template has a configuration in which three two-dimensional templates are stacked. In a three-dimensional template, the height of the reference template 9c is equal to the total of the thicknesses of the two-dimensional templates. When the three-dimensional template 9c is placed on the sample holder 3 and brought into a tilt state and the three-dimensional template 9c in the tilt state is photographed, image distortion in the height direction can be calculated using the reference targets at different heights included in the photographed image. Then, when the image distortion value as calculated is converted into a value in the height direction from a reference level of the reference template 9c using the distance from the axis O of rotation of the sample holder 3, correction of a space in the height direction can be performed.

When the reference template is three-dimensional as above, the heights of the reference template 9c generates the same effect as acquiring images of a two-dimensional reference template at a plurality of angles. That is, image distortion in the height direction can be calculated using the reference targets on the three-dimensional template 9c at different heights at the tilt angle. Then, when the image distortion value as calculated is converted into a value in the height direction from a reference level of the reference template 9c using the distance from the axis O of rotation of the sample holder 3, correction of a space in the height direction can be performed. That is, since a distortion correction factor corresponding to the height of the template can be acquired, the tilting may be coarse in angle.

In an apparatus constituted as described above, the electron beam system 20 acquires the positions of targets in the image of the reference template and a correction factor for removing the distortion in the direction of the height of the reference template at every tilt angle. Then, a sample 9 is placed on the sample holder 3 in place of the reference template, and an image of the sample 9 as a subject is acquired at a tilt angle by the electron beam measuring device 20.

The electron beam measuring device 20 then corrects the image of the sample 9 based on approximate height and position of the sample 9. That is, the tilt angle of the reference template 9a used for correction of the electron beam system 2 can be obtained from the approximate height and position of the subject (sample 9), and image distortion in every part of the subject at the tilt angle can be calculated based on the image distortion pattern at the tilt angle. Image distortion at every part of the subject is calculated with respect to the entire portion thereof for each subject, and the image of the sample 9 is corrected to compensate for the image distortion. Alternatively, the image distortion may be calculated as an image distortion pattern at each height (space) of the electron beam system 20 and stored into a memory of the electron beam system 20. That is, using information on the positions of the targets on the reference template 9a as shown in FIG. 4, a distortion factor of the targets on the reference template 9a at each tilt angle can be acquired.

First Embodiment

Figure 1:
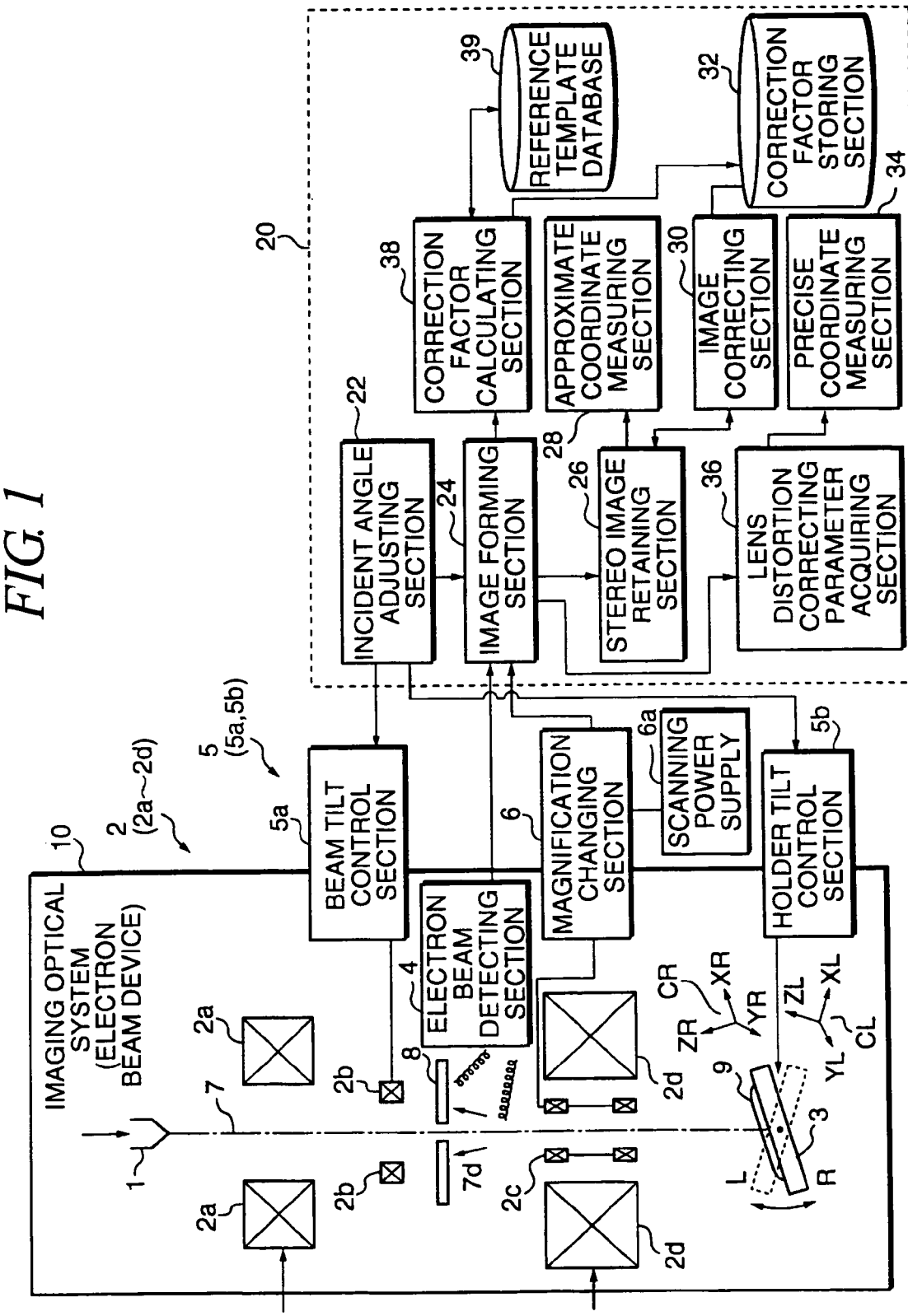
FIG. 1 is a block diagram illustrating the entire structure of a first embodiment of this invention.

Description will be hereinafter made of the embodiments of this invention with reference to the drawings. FIG. 1 is a block diagram illustrating the structure of a first embodiment of this invention. In the first embodiment, the rotational angle of the holder for holding an object is adjusted to adjust the tilt angle of the object so that a stereo image of the object can be obtained. As shown in the drawing, an electron beam device 10 (scanning electron microscope) as an imaging optical system has an electron beam source 1 for emitting an electron beam 7, an electron optical system 2 for irradiating the electron beam 7 on an object 9, a sample holder 3 for tiltably holding the object 9, a magnification changing section 6 for changing the magnifying power of the electron optical system 2, a scanning power supply 6a for supplying electric power to the magnification changing section 6, a detector 4 for detecting the electron beam 7, a holder tilt control section 5b as a tilt control section 5 for controlling the tilt of the sample holder 3, and a secondary electron converting target 8 for attenuating the energy of secondary electrons emitted from the object 9 and reflecting the electrons to the detector 4. A beam tilt control section 5a as a tilt control section 5 for controlling the tilt of the electron beam 7 is not used in the first embodiment but used in the fourth embodiment described later.

The electron beam system of this invention, which is typically the electron beam measuring device 20, may be a system having an electron beam device 10 connected to the electron beam measuring device 20. When the electron beam system has the electron beam measuring device 20 and the electron beam device 10, the electron beam system may be referred to as "electron beam observing device."

The electron optical system 2 has condenser lenses 2a for changing the electron flow density, diverging angle and irradiation area of the electron beam 7 emitted from the electron beam source 1, deflection lenses 2b for controlling the incident angle of the electron beam 7 on a sample surface, a scanning lenses 2c for deflecting the finely concentrated electron beam 7 to cause it to scan the sample surface two-dimensionally, and objective lenses 2d which focus the incident probe beam on the sample surface and serve as condensing lenses in the final stage. The area on the sample surface which the scanning lenses 2c cause the electron beam 7 to scan is determined according to a magnification changing command from the magnification changing section 6. The beam tilt control section 5b sends a tilt control signal to the sample holder 3 to switch it between a first attitude 3L in which it makes a first tilt angle defined with the sample holder 3 and the electron beam 7 and a second attitude 3R in which it makes a second tilt angle relative to the electron beam 7.

The three-dimensional coordinates $C_L$ of the object 9 placed on the sample holder in the first attitude 3L are ($X_L$, $Y_L$, $Z_L$) when represented in a fixed coordinate system of the electron beam device 10. The three-dimensional coordinates $C_R$ of the object 9 placed on the sample holder in the second attitude 3R are ($X_R$, $Y_R$, $Z_R$) when represented in a fixed coordinate system of the electron beam device 10. Although illustrated is the case in which the holder tilt control section 5b can switch the tilt angle of the sample holder 3 relative to the electron beam 7 between an angle R tilted upward to the right and an angle L tilted upward to the left, the sample holder 3 may be configured to be tilted at multiplicity of angles. At least two angles are necessary to obtain stereo detection data. When a yaw axis, a pitch axis and a roll axis are set as a three-dimensional coordinate system of the object 9, the yaw axis, the pitch axis and the roll axis correspond to Z-axis, X-axis and Y-axis, respectively.

The object 9 is a chip of a semiconductor material such as a silicon semiconductor or a gallium arsenide semiconductor, or may be an electronic component such as a power transistor, a diode, or a thyristor, or display device components using glass such as a liquid crystal panel or an organic EL panel. Under typical observing conditions of a scanning microscope, the electron beam source 1 is set to a potential of −3 kV and the object 9 to −2.4 kV. Secondary electrons emitted from the object 9 are attenuated in energy as they collide with the secondary electron converting target 8 and detected with the detector 4. When the object 9 is set to the ground potential, the secondary electrons behave like mist with a low energy and can be detected directly with the detector 4. In this case, the secondary electron converting target 8 is not required.

The electron beam measuring device 20 has an incident angle adjusting section 22, an image forming section 24, a stereo image retaining section 26, an approximate coordinate measuring section 28, an image correcting section 30, a correction factor storing section 32, a precise coordinate measuring section 34, a lens distortion correcting parameter acquiring section 36, a correction factor calculating section 38, and a reference template database 39.

The incident angle adjusting section 22 adjusts the attitude of the object 9 to adjust the relative incident angle of the beam 7 irradiated from the electron beam device 10 to the object 9 so that a stereo image of the object 9 can be formed. That is, the incident angle adjusting section 22 sends a control signal to the holder tilt control section 5b to adjust the attitude of the object 9. In addition, the incident angle adjusting section 22 sends a control signal to the holder tilt control section 5b to adjust a reference surface to be scanned by the electron beam 7 emitted from the electron beam source 1 so that right and left images necessary to form a stereo image can be formed. The image forming section 24 forms an image of the sample surface using a secondary electron beam detected with the detector 4 when the electron beam 7 is caused to scan an area on the sample surface by the scanning lenses 2c.

The stereo image retaining section 26 retains a stereo image of the object 9 formed by the electron beam device 10 using the image forming section 24 when the incident angle adjusting section 22 adjusts the incident angle of the electron beam 7 relative to the object 9. As the stereo image retaining section 26, a memory device for storing image information is used.

The approximate coordinate measuring section 28 obtains an approximate shape or approximate coordinate values of the sample 9 based on an output corresponding to a stereo image from the electron beam detecting section 4. The image correcting section 30 corrects the stereo image according to the tilt angle created by the sample tilting section 5 based on the shape or coordinate values of the sample obtained in the approximate coordinate measuring section 28 using a correction factor stored in the correction factor storing section 32. The correction factor storing section 32 stores correction factors such as height correcting parameters at a reference tilt angle with respect to a plane which is used to tilt the sample 9 by the sample tilting section 5.

The precise coordinate measuring section 34 obtains a shape or coordinate values of the sample which are more precise than those obtained in the approximate coordinate measuring section 28 based on a corrected stereo image obtained in the image correcting section 30. The lens distortion correcting parameter acquiring section 36 acquires lens distortion correcting parameters for use in correcting the lens distortion of the electron optical system 2. The correction factor calculating section 38 obtains a correction factor by comparing the shape or coordinate values of the reference template 9a measured based on a stereo image thereof with the shape or coordinate values of characteristic points. The reference template database 39 stores information for locating the positions of the targets on the reference template 9a.

Figure 10:
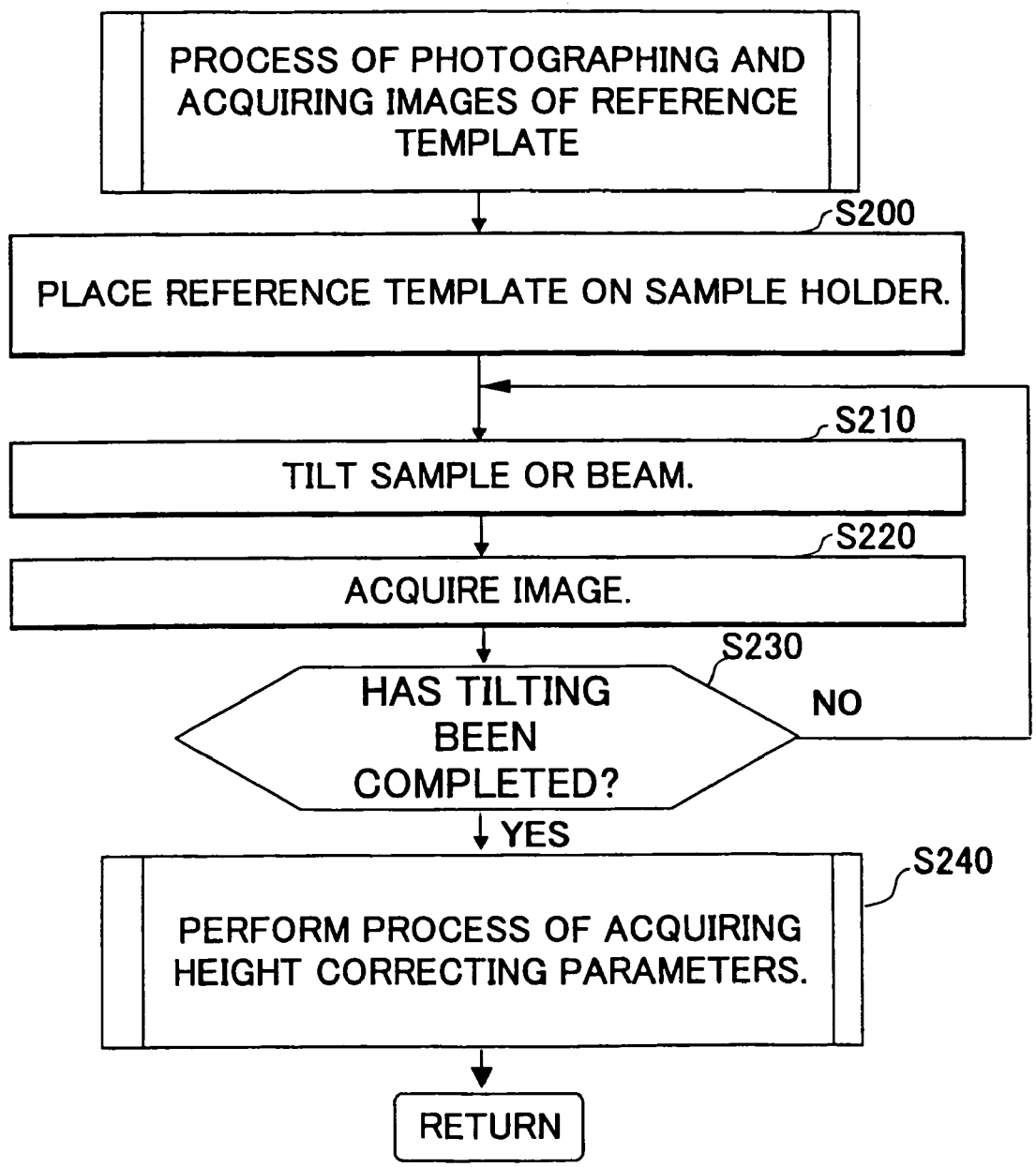
FIG. 10 is a flowchart used to explain the process of photographing and acquiring images of a reference template.

Referring to FIG. 10, a process of photographing and acquiring images of a reference template in the apparatus constituted as described above will be described. FIG. 10 is a flowchart used to explain the process of photographing and acquiring images of a reference template. A reference template 9a is placed on the sample holder 3 (S200). Then, the beam tilt angle control section 5b sends a tilt control signal to the sample holder 3 and the incident angle adjusting section 22 adjusts the incident angle of the electron beam 7 relative to the object 9 (S210). When targets on the reference template 9a are arranged two-dimensionally, the electron beam 7 and the object 9 are tilted at a plurality of angles relative to each other as shown in FIG. 2, for example, and a reference template image is acquired at each of the tilt angles.

That is, the electron beam device 10 photographs images of the reference template 9a and the electron beam measuring device 20 stores the images as stereo images of the reference template 9a in the stereo image retaining section 26 (S220). Then, the electron beam measuring device 20 determines whether the number of images required in the process of photographing and acquiring images of the reference template have been acquired (S230). If it is determined as No in step S230, that is, it is determined that the required number of images have not been acquired yet, the procedure goes back to step S210 and more images are acquired. If it is determined as yes in step S230, that is, it is determined that the required number of images have been acquired, the procedure goes to a process of acquiring height correcting parameters (S240).

Figure 11:
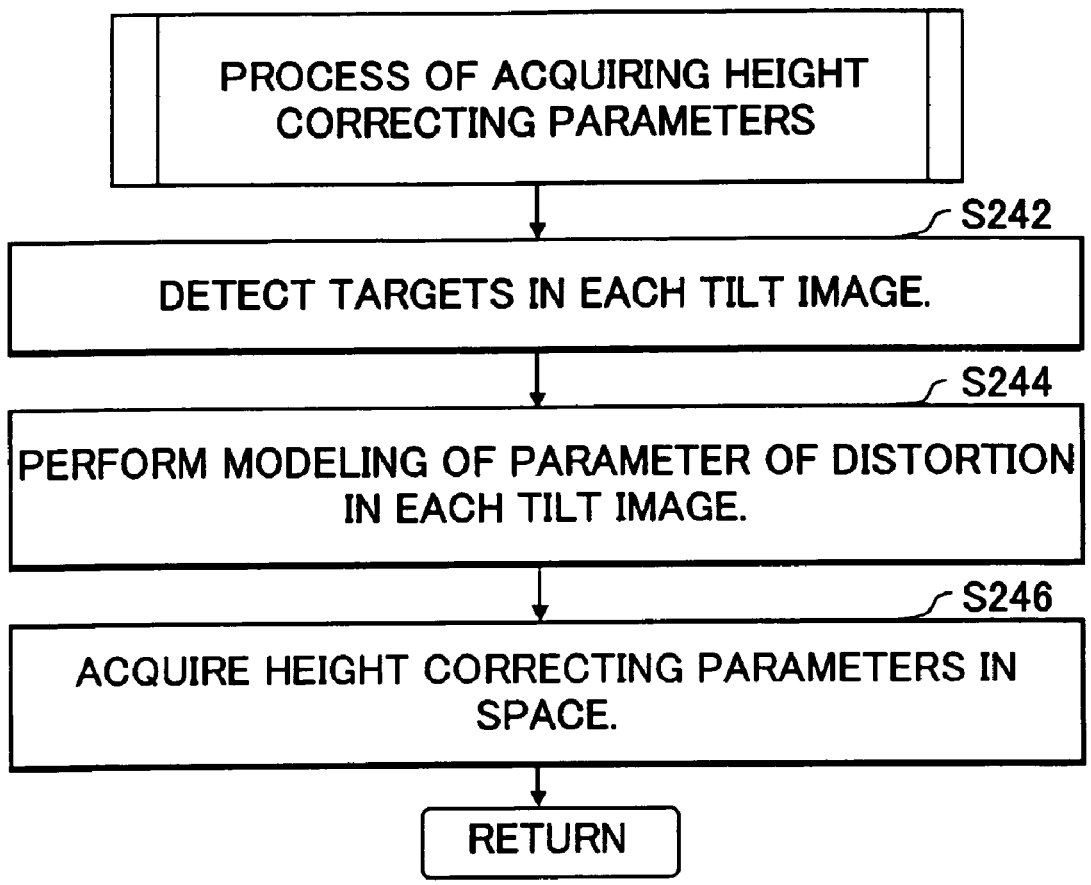
FIG. 11 is a flowchart used to explain the process of acquiring height correcting parameters.

FIG. 11 is a flowchart used to explain the process of acquiring height correcting parameters. First, the correction factor calculating section 38 detects targets in each of the tilt images (S242). Here, since the positions of the targets to be detected have been stored in the reference template database 39, erroneous correspondence of the targets can be avoided. Thus, even when there are points similar to each other, measurement can be carried out only by designating a several points (automatic recognition) according to the following steps (i) to (iv).

(i) Reading out information on the positions of patterns on the reference template 9a from the reference template database 39. At this time, the design values, the distance between the patterns and so on are also acquired if the information has been known. The read out information on the positions of the patterns is set as reference point coordinates.

(ii) Approximately designating at least three points each on a reference image and a search image corresponding to each other when a template matching method is used for image recognition. The approximately designated corresponding points are set as image coordinates.

(iii) Calculating parameters for the reference image and search image from the following equations. That is, observation equations are established by putting the image coordinates and corresponding reference point coordinates into the quadratic projective transformation equations (1) to obtain the parameters b1 to b8.

$$X=(b1x+b2y+b3)/(b7x+b8y+1)$$

$$Y=(b4x+b5y+b6)/(b7x+b8y+1) \quad (1)$$

wherein X, Y are image coordinates and x, y are reference point coordinates.

(iv) Obtaining the positions of all the patterns on the reference image and the search image by calculation using the parameters b1 to b8.

(v) Performing stereo matching on the areas around the thus obtained positions corresponding to the patterns and performing three-dimensional measurement.

[Stereo Matching Process]

Figure 12:
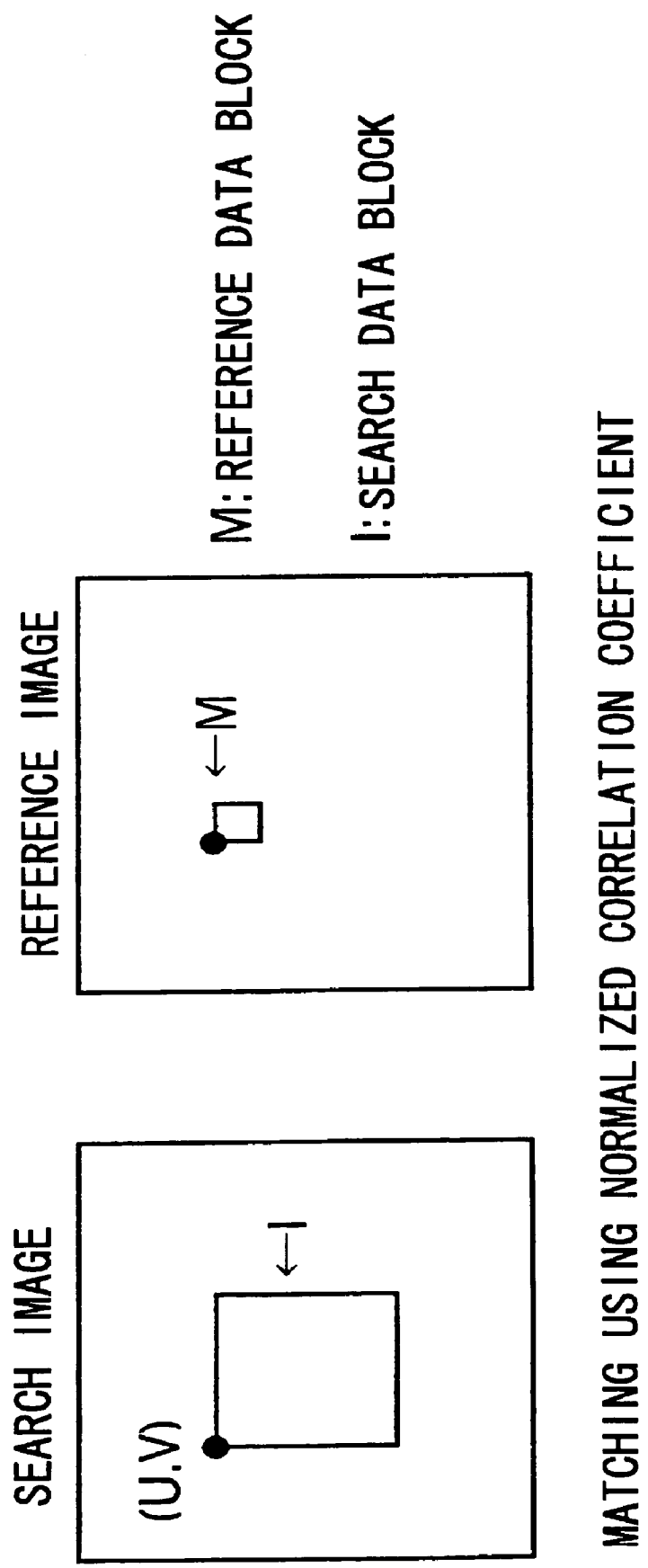
FIG. 12 is an explanatory view of a matching method using a normalized correlation coefficient.

An area base matching using a normalized correlation coefficient as an example of the stereo matching process will be described. FIG. 12 is an explanatory view used to explain the matching method using a normalized correlation coefficient. In the drawing, the right and left images are a reference image and a search image, respectively. Here, a reference data block in the reference image constituted of N-number of data is denoted as M, and a search data block in the search image having a starting point at the coordinates (U, V) is denoted as I.

In the matching method using a normalized correlation coefficient, the degree of similarity between the reference data block M and the search data block I at each point is obtained from the correlation coefficient while performing raster scanning in the search data block I in such a manner that the reference data block M is moved in the search data block I from left to right, and when reaching the right end of the search data block I, the reference data block M is moved to the left end of the row below it and moved from left to right again. When the position where the correlation coefficient R has its maximum can be found, a block coincident with the reference data block M in the search data block I can be found.

When $M=M(Xi, Yi)$ $(1<i<N)$ (2)

and $I=I(U+Xi, V+Yi)$ (3)

the normalized correlation coefficient R(U, V) is obtained by the following relation:

$R(U, V)=(N\Sigma IiMi-\Sigma Ii\Sigma Mi)/SQRT[\{N\Sigma Ii^2-(\Sigma Ii)^2\}\times \{N\Sigma Mi^2-(\Sigma Mi)^2\}]$ (4)

The correlation coefficient R always takes a value between −1 and +1. When the correlation coefficient R is +1, the template and the search image completely coincide with each other.

Then, as shown in FIG. 11, the correction factor calculating section 38 calculates modeling parameters for detection points on which target detection has been performed by a parallel projection calibration method, least squares approximation, or affine transformation described in detail later (S244). In the affine transformation, the following relational equation (5) is used (the equation (5) will be described in detail later).

$x'=b1x+b2y+b3$ $y'=b4x+b5y+b6$ (5)

Figure 13:
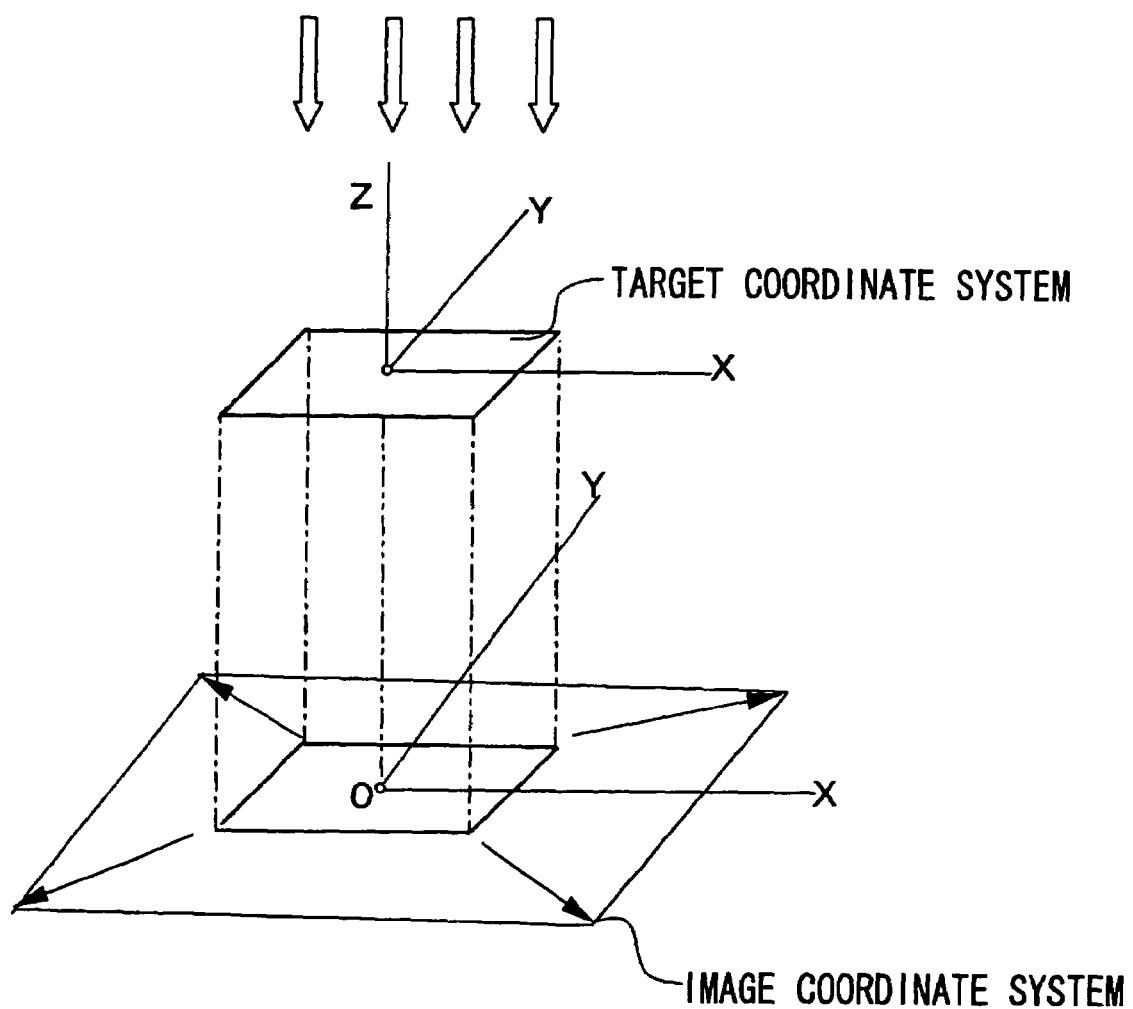
FIG. 13 is an explanatory view of the ground coordinates and the image coordinates in a parallel projection method.

FIG. 13 is an explanatory view of the ground coordinates (object coordinates) and the image coordinates in a parallel projection method. In the electron beam device 10, the images of the object 9 are parallel projection images because of the nature of the electron beam 7. The operations in steps S242 and S244 are performed by measuring at least six reference points on the ground coordinate system and the image coordinate system with a successive approximation method. The above is the stereo matching process.

[Parallel Projection Calibration Method]

Using the principle of a parallel projection method, a correction model equation for an electron lens is established to carry out modeling.

[Equation 1]

$$\begin{bmatrix} x \\ y \\ 0 \end{bmatrix} = \begin{bmatrix} K_1 & 0 & 0 \\ 0 & K_2 & 0 \\ 0 & 0 & 0 \end{bmatrix} \begin{bmatrix} X_R \\ Y_R \\ Z_R \end{bmatrix}$$ (6)

wherein x, y are image coordinates, K1 and K2 are scales.

Then, the following equation can be obtained:

[Equation 2]

$$WASH\_1\epsilon \begin{bmatrix} X_R \\ Y_R \\ Z_R \end{bmatrix} = A \begin{bmatrix} X-X_0 \\ Y-Y_0 \\ Z-Z_0 \end{bmatrix}$$ (7)

wherein $X_R, Y_R, Z_R$ are object coordinate in consideration of rotation, $X_0, Y_0, Z_0$ are origin selected on the object coordinate system, and A is an orientation matrix. The orientation matrix A is described in paragraph [0041] of JP-A-2002-270127, for example, applied by the same applicant of this invention.

[Modeling]

Next, modeling of distortion aberration of the electron lens system is performed. By obtaining a plurality of reference points and images taken from a plurality of angles, correction can be made using the following equation. Then, when x, y coordinates of which the lens distortion is corrected with the equation (6) are represented as x', y', the following relations hold:

$x'=x+\Delta x$ $y'=y+\Delta y$ (8)

$\Delta x$ and $\Delta y$ are represented by the following equations:

[Equation 3]

$$\Delta x = x_0 + x(k_1 r^2 + k_2 r^4)$$
$$\Delta y = y_0 + y(k_1 r^2 + k_2 r^4)$$
$$r^2 = (x^2 + y^2)/c^2$$ (9)

Since the lens distortion coefficient is another unknown variable, when the number of reference points is increased and their image coordinates and object coordinates are measured, the calculation can be made by applying the above equations with a successive approximation method. Although the lens distortion coefficient is a radial distortion coefficient in the above equation, when other distortion parameters such as tangential and spiral distortion coefficient are included in the equation in obtaining the coefficient, they can be included in the model.

Then, as shown in FIG. 11, the correction factor calculating section 38 obtains height correcting parameters in a space in the vicinity of the reference template photographed by the electron beam device 10 (S246). For example, the positions of the tilt angles at a height of b are obtained as shown in FIG. 2 and the distortions thereof are stored in the correction factor storing section 32. When height correcting parameters are calculated at each height, image distortion at each height can be obtained. The image distortion may be stored in the correction factor storing section 32 or the distortion may be put into parameters by least square approximation or affine transformation.

Figure 14:
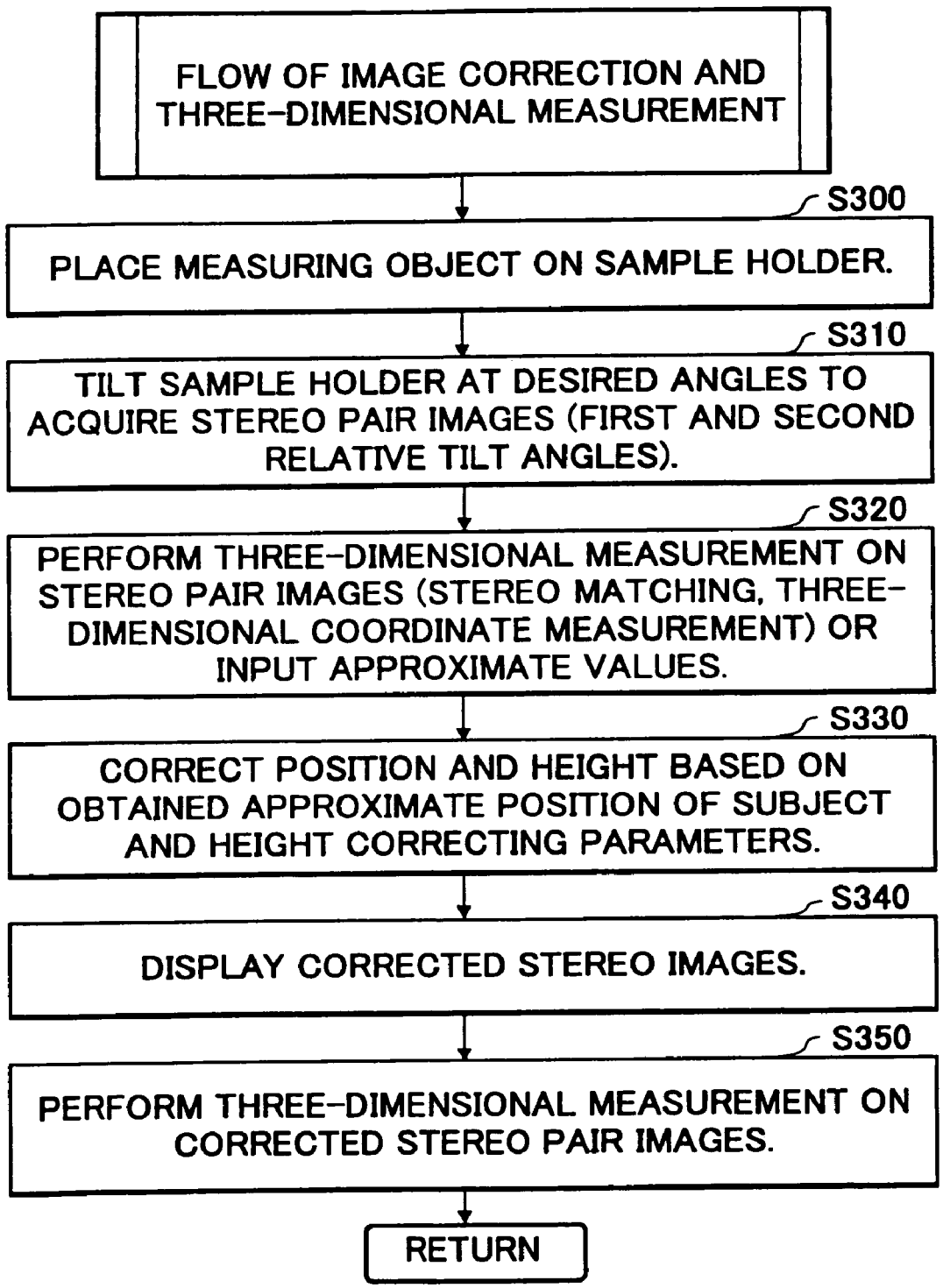
FIG. 14 is a flowchart used to explain the procedure for correcting a sample image photographed in the electron beam device 10.

Referring to FIG. 14, the procedure for correcting a sample image photographed by the electron beam device 10 using the height correcting parameters obtained according to the flowcharts shown in FIG. 10 and FIG. 11 will be described. FIG. 14 is a flowchart used to explain the procedure for correcting images of a sample photographed by the electron beam device 10. A measuring object 9 is placed on the sample holder 3 (S300). The incident angle adjusting section 22 tilts the sample holder 3 at desired angles and stereo pair images of the measuring object 9 are acquired (S310). The tilt angles are determined based on what part of the measuring object 9 is necessary to be viewed or the required measurement accuracy. For example, the step S310 includes a first data detection step in which the electron beam detecting section 4 detects first detection data when the sample holder 3 and the electron beam 7 form a first tilt angle relative to each other and a second data detection step in which the electron beam detecting section 4 detects second detection data when the sample holder 3 and the electron beam 7 form a second tilt angle relative to each other. Then, the approximate coordinate measuring section 28 of the electron beam measuring device 20 performs approximate three-dimensional measurement of the measuring object 9 (S320).

When the measuring object 9 is a mass production product such as a semiconductor chip, the height and positional information of the measuring object 9 have been known in advance. Thus, the known information may be inputted into the electron beam measuring device 20. Alternatively, the three-dimensional measurement may be carried out in step S350 using both the known information about the shape of the measuring object 9 and the measurement result. The method for the three-dimensional measurement of the measuring object 9 with images thereof will be described.

[Stereo Matching Process]

A stereo matching process generally the same as the stereo matching process described before is performed. Refer Japanese Application No.2002-351844 for the details.

[Measurement of Height]

Figure 15:
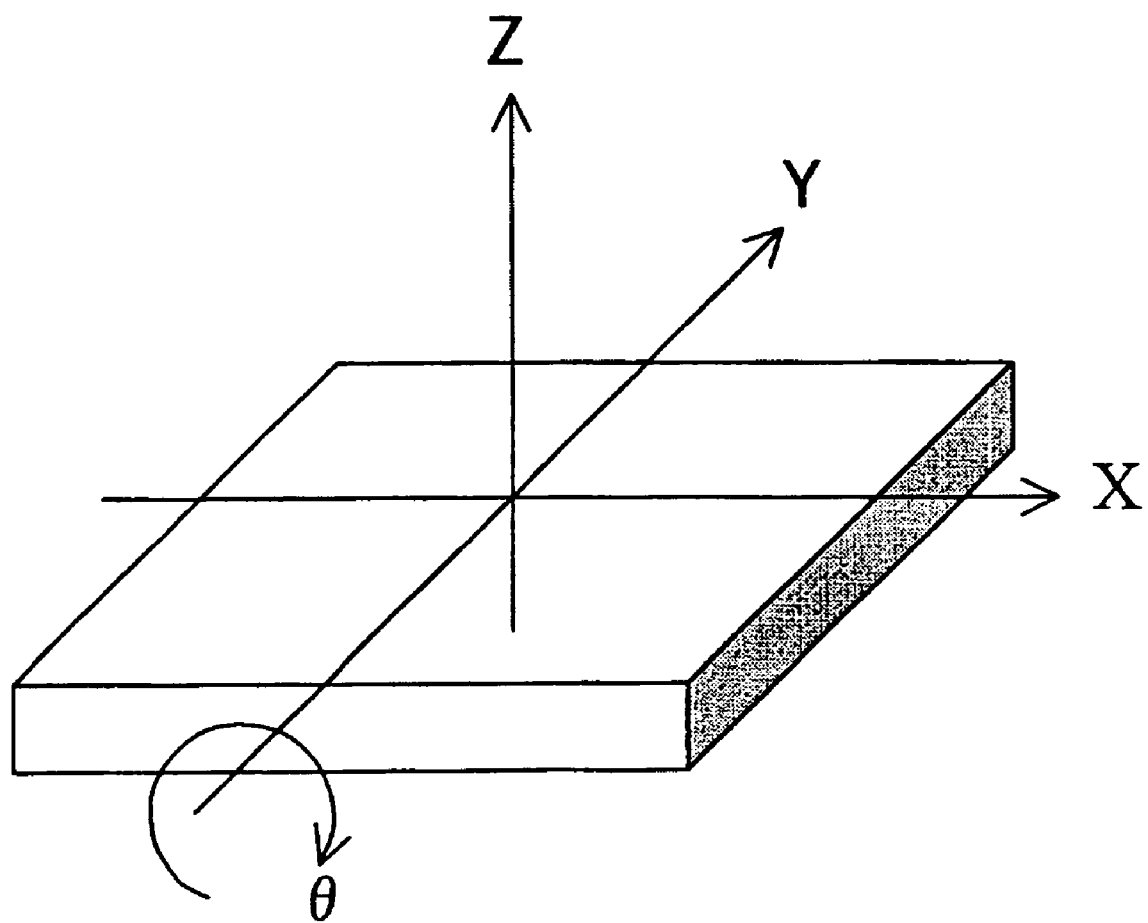
FIG. 15 is a perspective view used to explain the coordinate system of the sample holder 3.

Photographing the measuring object 9 tilted at an angle $\theta$ is equivalent to photographing the measuring object 9 with an electron beam tilted at an angle $\theta$ by an electron beam or observation optical axis tilting mechanism. FIG. 15 is a perspective view used to explain the coordinate system of the sample holder 3. In the coordinate system of the sample holder 3, the Y-axis is the axis of rotation, and the clockwise turn is taken to be the + direction of the angle $\theta$.

Figure 16:
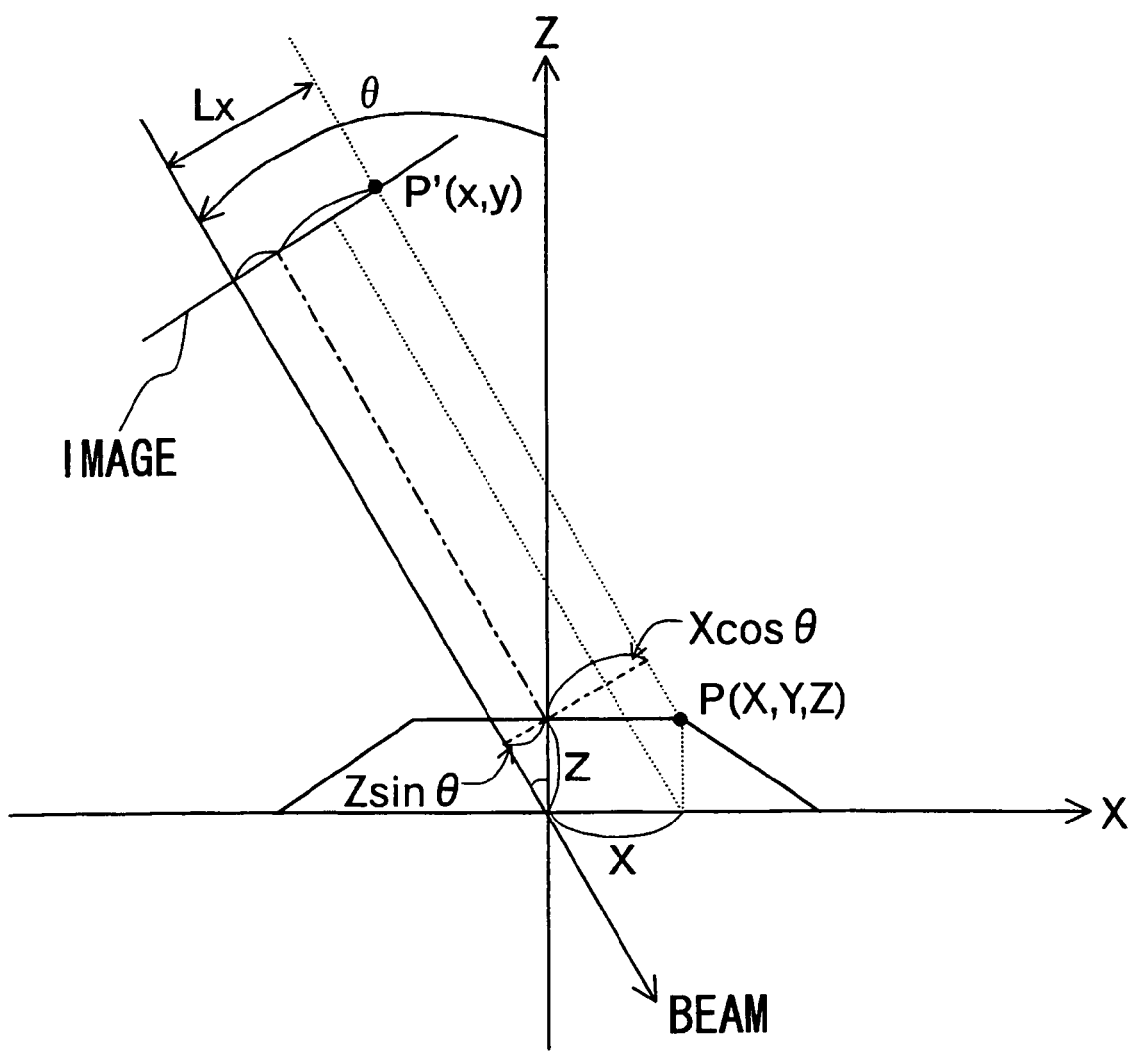
FIG. 16 is a front view illustrating the relation between an image and a sample when an electron beam is irradiated on a measuring object 9.

FIG. 16 is a front view illustrating the relation between an image and the sample when an electron beam is irradiated on a measuring object 9. From a geometric relation, Left image: $Lx=(X\times\cos\theta+Z\times\sin\theta)\times s$ (10)

$Ly=Y$

Right image: $Rx=(X\times\cos\theta-Z\times\sin\theta)\times s$ $Ry=Y$ (11)

wherein s: resolution (1 pixel).

When three-dimensional coordinates are obtained by applying equation (7) (in consideration of the rotational angle of the image and the sample), $X=Lx+Rx$ $Z=Lx-Rx$ $Y=Ly=Ry.$ (12)

Figure 17:
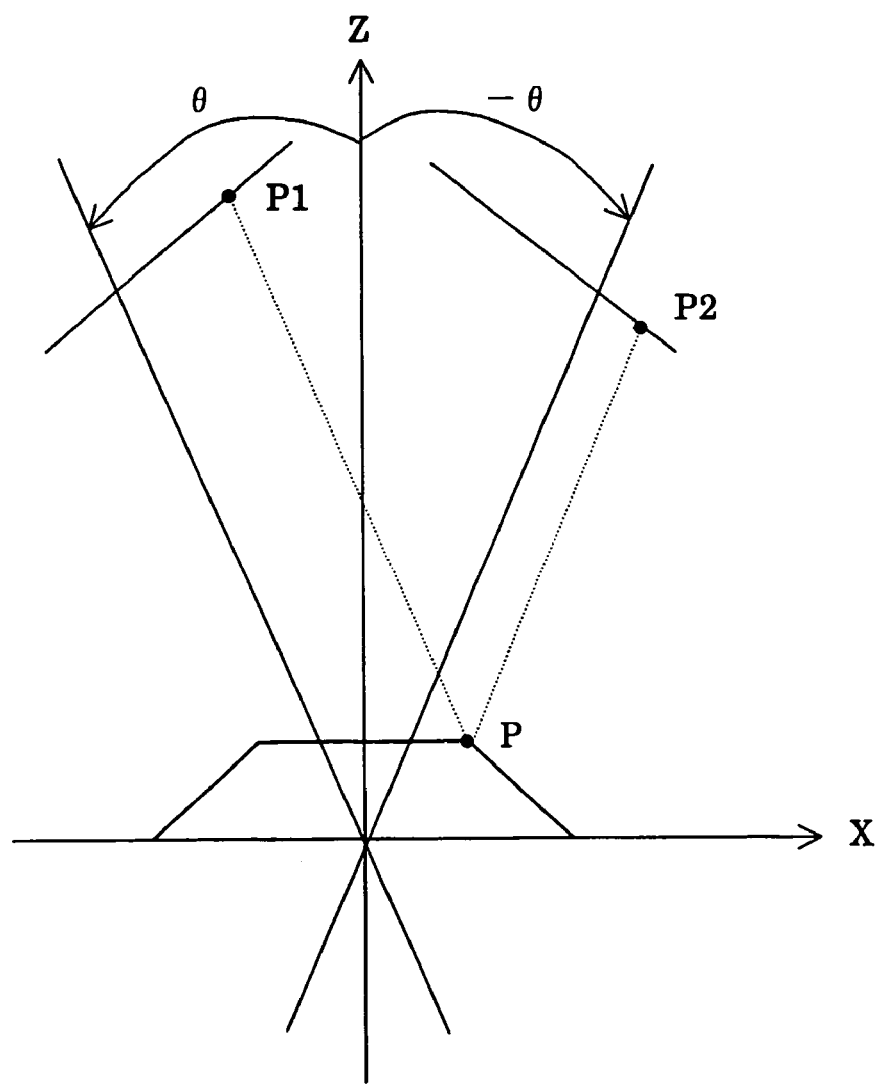
FIG. 17 is an explanatory view of the photographing directions of a stereo pair images photographed from angles on both sides of the Z-axis.
Figure 18:
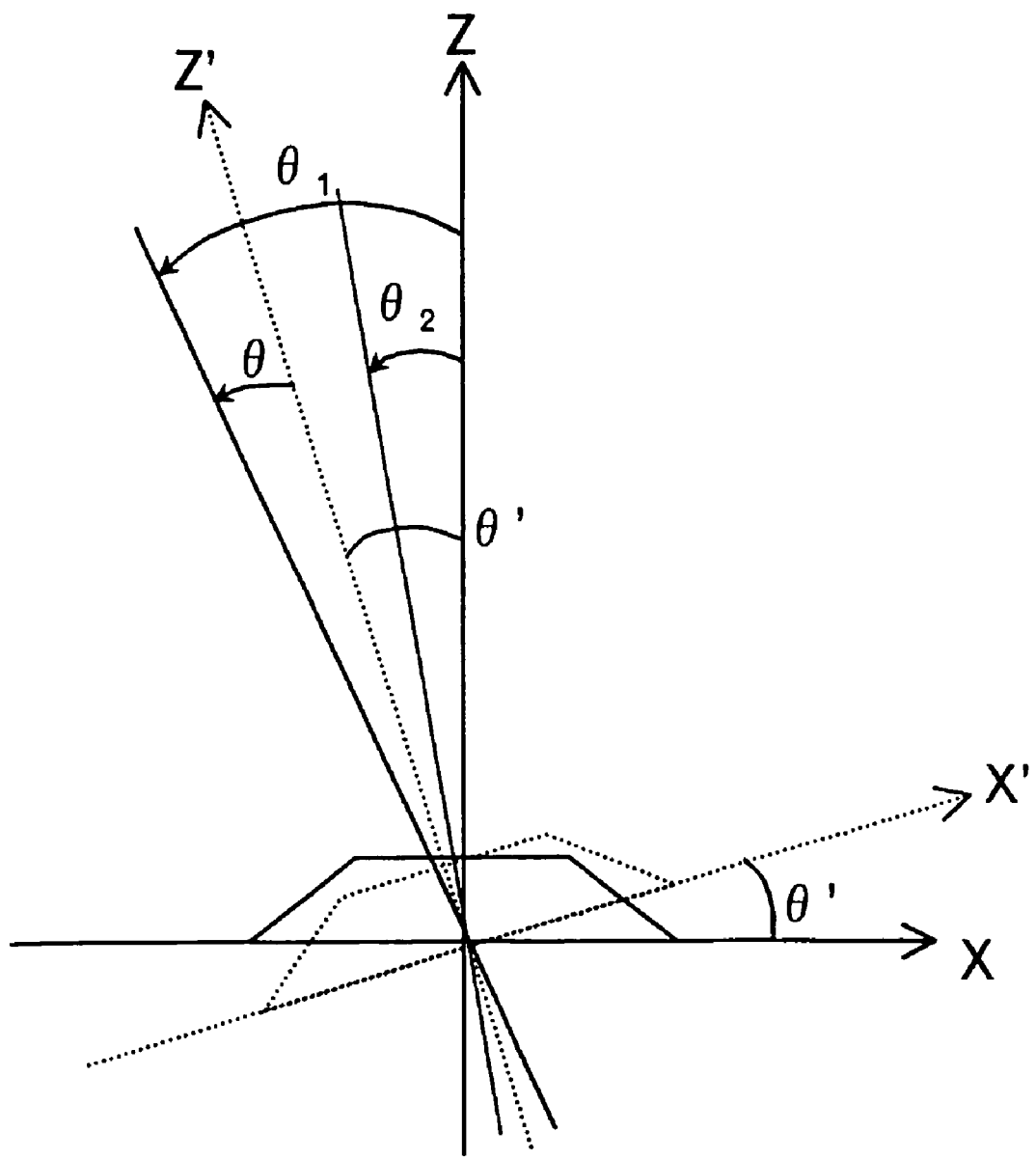
FIG. 18 shows a case in which the angles at which right and left images as a stereo pair are photographed are tilted at angles of θ1 and θ2, respectively, with respect to the Z-axis.

Equations (12) are available only when the right and left images are photographed from angles on both sides of the Z-axis as shown in FIG. 17. Next, an equation which can be used irrespective of the angle will be obtained. FIG. 18 shows a case in which the photographing angles of the right and left images are tilted at angles of $\theta 1$ and $\theta 2$, respectively, with respect to the Z-axis.

The left image is photographed at an angle $\theta 1$ and the right image is photographed as an angle $\theta 1$. Here, a Z'-axis which is titled at an angle $\theta'$ with respect to the Z-axis is assumed. Assume that the photographing angles of the right and left images in FIG. 18 are symmetric with respect to the Z'-axis. When pseudo-coordinates (X', Y', Z') are applied, the angles of the images are $\theta'\pm\theta$. Then, the equation (11) can be used. After that, the pseudo-coordinates (X', Y', Z') are rotated by an angle $\theta'$ to a coordinate system X, Y, Z.

$Z'=((Lx-Rx)/(2\times\sin\theta))\times s$ $X'=((Lx+Rx)/(2\times\cos\theta))\times s$ $Y'=Ly=Ry$ (13)

Thus, the following equations hold:

$X=X'\times\cos\theta'-Z'\times\sin\theta'$ $Z=X'\times\sin\theta'-Z'\times\cos\theta'$ $Y=Y'$ (14)

Then, as shown in FIG. 14, the image correcting section 30 and the correction factor storing section 32 of the electron beam measuring device 20 generate lens distortion-corrected stereo pair images of the measuring object 9 using the approximate position and height of the subject obtained in step S320 and the height correcting parameters obtained according to the procedure shown in FIG. 11 (S330). The thus generated stereo pair images of the measuring object 9 are thus displayed on a display device such as a CRT of the electron beam measuring device 20 (S340). Then, the precise coordinate measuring section 34 and the lens distortion correcting parameter acquiring section 36 of the electron beam measuring device 20 perform three-dimensional measurement of the measuring object 9 on the stereo pair images thereof to obtain the precise positions and heights of the characteristic points on the measuring object 9 (S350). When observation of the images corrected in step S340 can satisfy the purpose, step S350 may be skipped. However, performing three-dimensional measurement again in step S350 allows more precise measurement. In step S350, a stereo matching process and a height measurement process are performed as in step S320.

Second Embodiment

Figure 19:
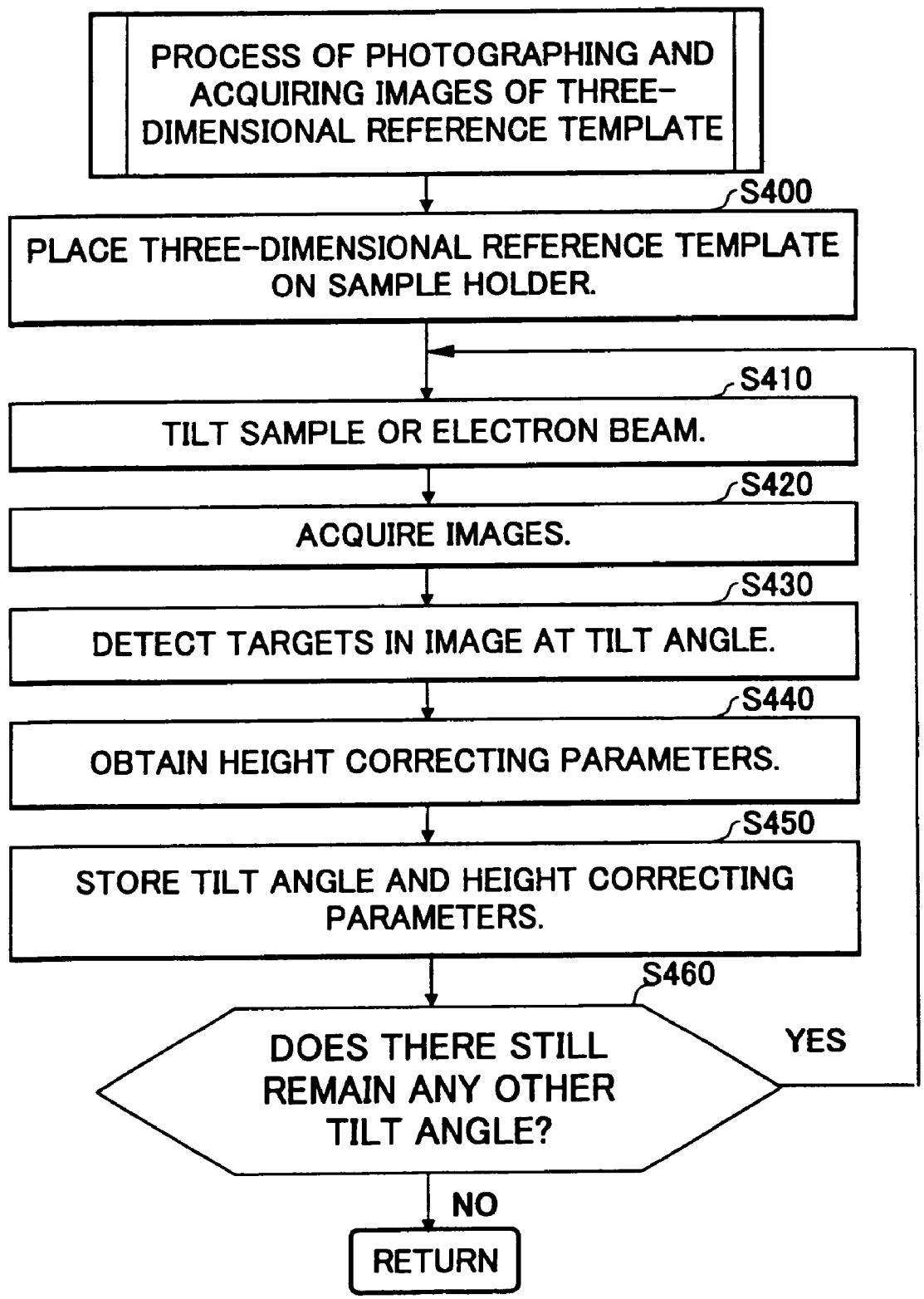
FIG. 19 is a flowchart used to explain the process of photographing and acquiring images of a three-dimensional reference template in a second embodiment of this invention.

Referring now to FIG. 19, a case will be described in which a three-dimensional template is used as a reference template. The process is generally the same as in the first embodiment except that the procedure for obtaining the height correcting parameters is suitable for a three-dimensional reference template. FIG. 19 is a flowchart used to explain the process of photographing and acquiring images of a three-dimensional reference template. A three-dimensional reference template 9c is placed on the sample holder 3 (S400). Then, the holder tilt angle control section 5b sends a tilt control signal to the sample holder 3 and the incident angle adjusting section 22 adjusts the incident angle of the electron beam 7 relative to the object 9 (S410). When the reference template 9c is three-dimensional, the interval between the tilt angles may be large or coarse as has been described with FIG. 9. The tilt angles which the incident angle adjusting section 22 sets in step S410 are so determined that a height correcting parameter acquiring process can be performed at every angle at which the measuring object 9 is measured. When the tilt angles are set with small intervals, various values can be selected as the tilt angles at which the measuring object 9 will be measured.

The electron beam device 10 photographs images of the reference template 9c and the electron beam measuring device 20 stores the images as stereo images of a three-dimensional reference template in the stereo image retaining section 26 (S420). Then, the correction factor calculating section 38 detects targets in the tilt images of the three-dimensional reference template (S430). The detection of targets can be made by the stereo matching process as in step S242 described before. The correction factor calculating section 38 obtains height correcting parameters in a space in the vicinity of the reference template 9c photographed by the electron beam device 10 (S440). The calibration method using parallel projection or modeling can be applied to the procedure for obtaining the height correcting parameters as in step S244 described before. The obtained height correcting parameters are stored in the correction factor storing section 32 (S450).

The electron beam measuring device 20 determines whether there still remain tilt angles necessary in the process of photographing and acquiring images of a three-dimensional reference template (S460). If it is determined as Yes in step S460, that is, it is determined that there still remain necessary tilt angles, the procedure goes back to step S410 and more images of the three-dimensional reference template are acquired. If it is determined as No in step S460, that is, the required number of images have been acquired, the procedure is returned.

The procedure for correcting the images photographed by the electron beam device 10 using the height correcting parameters obtained according to the flowchart in FIG. 19 is the same as that in the first embodiment. That is, the images can be corrected according to the flowchart shown in FIG. 14.

Third Embodiment

Figure 20:
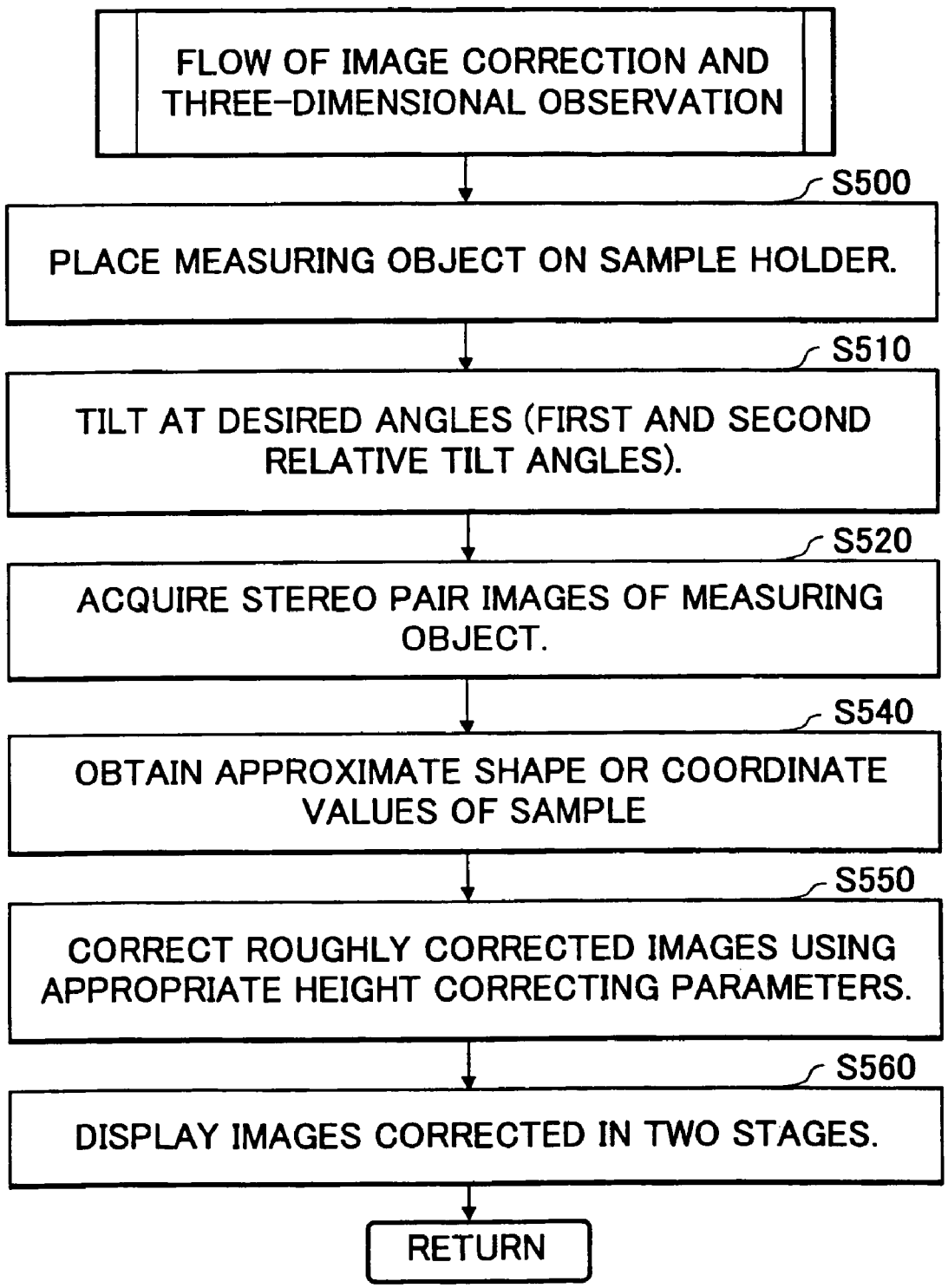
FIG. 20 is a flowchart used to explain the procedure for observing a sample using images of the sample photographed by the electron beam device 10.

Description will be made of a third embodiment with reference to FIG. 20. The third embodiment relates to the procedure for observing a sample with images thereof photographed by the electron beam device 10 using the height correcting parameters obtained in the first or second embodiment. FIG. 20 is a flowchart used to explain the procedure for observing a sample with images of the sample photographed by the electron beam device 10. A measuring object 9 is placed on the sample holder 3 (S500). The incident angle adjusting section 22 tilts the sample holder 3 at desired angles (S510). The tilt angles are determined based on what part of the measuring object 9 is necessary to be viewed or the required measurement accuracy. For example, the sample holder 3 and the electron beam 7 make the first and second tilt angles relative to each other. The electron beam measuring device 20 acquires stereo pair images of the measuring object 9 (S520). The stereo pair image data detected with the electron beam detecting section 4 corresponding to the first and second relative tilt angles are set as first and second detection data, respectively.

The approximate coordinate measuring section 28 obtains an approximate shape or approximate coordinate values of the sample based on outputs corresponding to images generated in the electron beam detecting section 4 (S540). The images generated in the electron beam-detecting section 4 include a stereo image composed of right and left images of the measuring object 9. The image correcting section 30 reads out a corresponding correction factor from the correction factor storing section 32 based on the shape or coordinate values of the sample 9 obtained in step S540 and corrects the images generated in the electron beam detecting section 4 (S550). Then, the electron beams measuring device 20 displays the images corrected in step S550 on a display device (not shown) (S560). In the third embodiment, since the sample image photographed by the electron beam device 10 is corrected in step S550, a precise stereo image of the measuring object 9 can be obtained.

Fourth Embodiment

Figure 21:
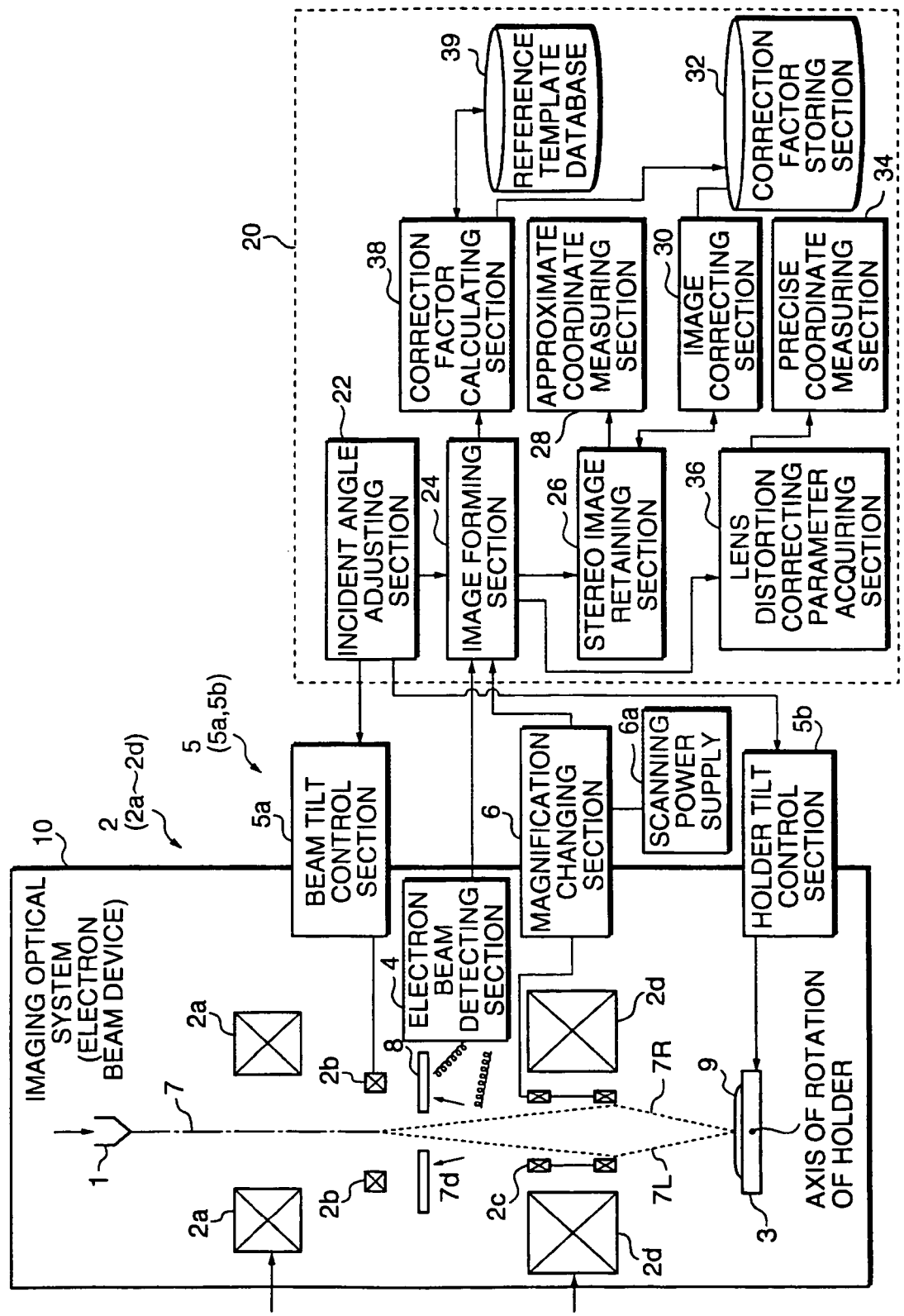
FIG. 21 is a block diagram illustrating the structure of a fourth embodiment of this invention.

FIG. 21 is a block diagram illustrating the structure of a fourth embodiment of this invention. The electron beam of the scanning microscope is deflected to obtain a stereo image in the fourth embodiment, while the holder is tilted to obtain a stereo image in the first embodiment. Those parts corresponding to the components of FIG. 1 are identified with the same numerals in FIG. 21, and their description is not repeated. A beam tilt control section 5a for controlling the tilt of the electron beam 7 is provided as the tilt control section 5. The beam tilt control section 5a sends a tilt control signal to the deflection lenses 2b so that the electron beam 7 is deflected to be an electron beam 7R which makes a first incident angle formed by the sample holder 3 and the electron beam 7 or an electron beam 7L which makes a second incident angle. The beam tilt control section 5a may be able to adjust the relative tilt between the electron beam 7 and the sample holder 3 to a plurality of angles. At least two angles are necessary to obtain data for stereo detection.

While the attitude of the object is adjusted around one single neutral axis in the above embodiments, this invention is not limited thereto. A plurality of tilt axes may be selected. When a plurality of tilt axes are used, correction can be made in various directions and three-dimensional measurement can be performed with high accuracy.

While the image correcting section corrects images based on the approximate shape or coordinate values of the sample measured in the approximate coordinate measuring section in the above embodiments, external information such as the design data of the sample may be given to the image correcting section as the approximate shape or coordinate values of the sample instead of the data from the approximate coordinate measuring section in an electron beam measuring device as an electron beam system.

Figure 22:
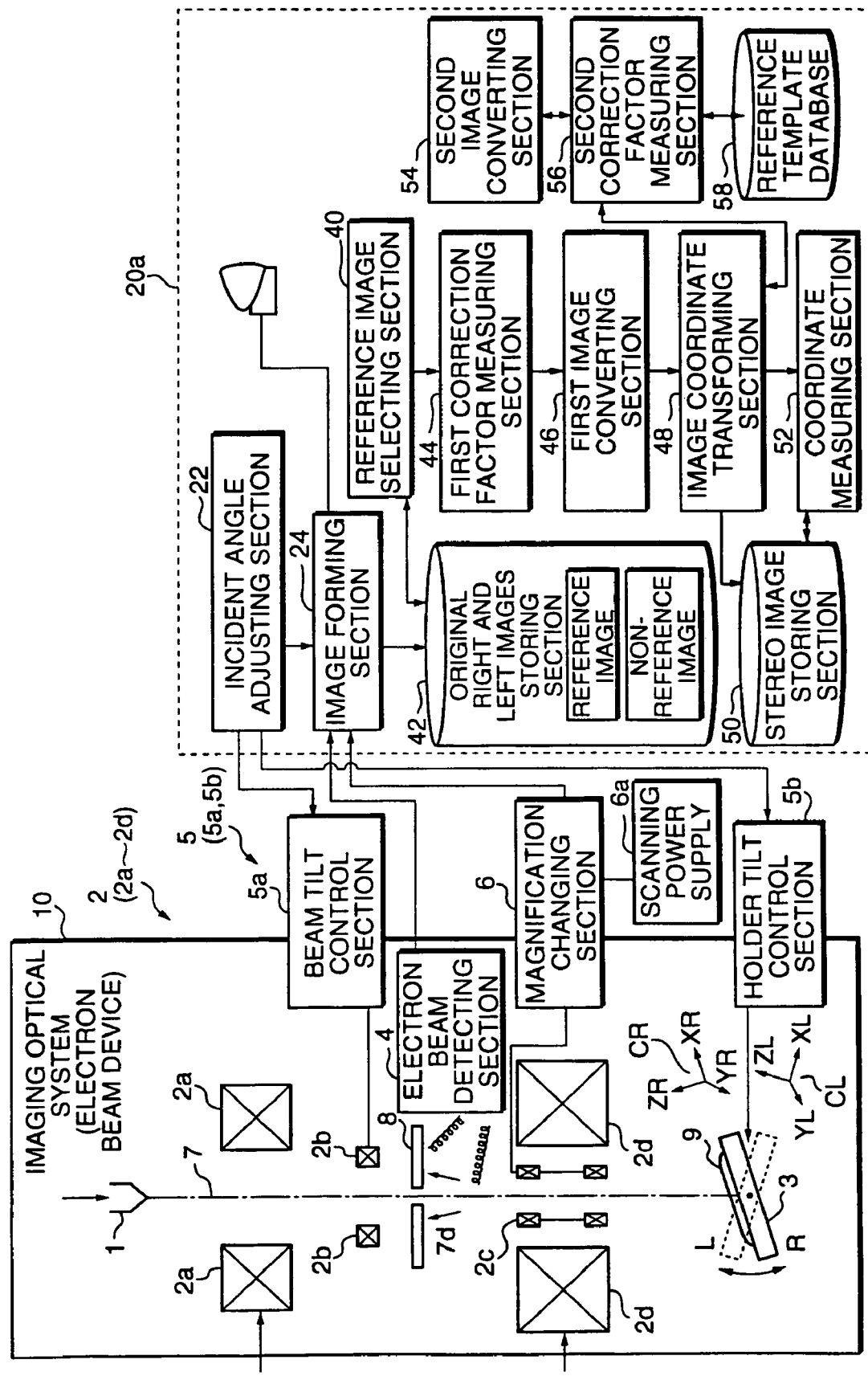
FIG. 22 is a block diagram illustrating the entire structure of a fifth embodiment of this invention.

Description will be made of a fifth embodiment of this invention with reference to FIG. 22. The matters having been described in the description of the embodiment shown in FIG. 1 may be omitted.

The electron beam measuring device 20a as an electron beam system has an incident angle adjusting section 22, an image forming section 24, a reference image selecting section 40, an original right and left images storing section 42, a first correction factor measuring section 44, a first image converting section 46, an image coordinate transforming section 48, a stereo image storing section 50, a coordinate measuring section 52, a second image converting section 54, a second correction factor measuring section 56, and a reference template database 58.

The incident angle adjusting section 22 adjusts the attitude of the object 9 to adjust the relative incident angle of the beam 7 irradiated from the electron beam device 10 to the object 9 so that a stereo image of the object 9 can be formed. That is, the incident angle adjusting section 22 sends a control signal to the holder tilt control section 5b to adjust the attitude of the object 9. In addition, the incident angle adjusting section 22 sends a control signal to the holder tilt control section 5b to adjust a reference surface to be scanned by the electron beam 7 emitted from the electron beam source 1 so that right and left images necessary to form a stereo image can be formed. The image forming section 24 forms an image of the sample surface using a secondary electron beam detected with the detector 4 when the electron beam 7 is caused to scan an area on the sample surface by the scanning lenses 2c.

In the reference image selecting section 40, one of right and left images for a stereo image obtained from the electron beam detecting section 4 is selected as a reference image. The selection may be made according to a designating signal indicating one of the right and left images designated by an operator, or the electron beam measuring device 20a may make the selection according a predetermined rule. The original right and left images storing section 42 stores images formed in the image forming section 24 as right and left images for forming a stereo image. The reference image selecting section 40 deals the right and left images as a reference image and a non-reference image. The first correction factor measuring section 44 obtains a first image correction factor which distorts the non-reference image into the distortion state of the reference image based on the correspondence between the right and left images, using the reference image selected by the reference image selecting section 40.

Here, the first correction factor measuring section 44 may obtain a first image correction factor which distorts the non-reference image selected from the right and left images by the reference image selecting section 40 into the distortion state of the reference image based on the correspondence between the right and left images, using the reference image selected by the reference image selecting section 40.

The first image converting section 46 converts the non-reference image using the first image correction factor obtained in the first correction factor measuring section 44. The image coordinate transforming section 48 performs a coordinate transformation of the reference image and an image converted from the non-reference image in the image converting section 46 to images which can be obtained when the relative tilt angle created by the sample tilting section 5 is in a standard state. The stereo image storing section 50 retains the stereo image processed in the image coordinate transforming section 48. As the stereo image retaining section 50, a memory device for storing image information is used. The coordinate measuring section 52 obtains the shape or coordinate values of the sample included in a stereo image composed of the non-reference image and reference image which have been subjected to a coordinate transformation in the image coordinate transforming section 48.

The second image converting section 54 converts the reference image and the non-reference image which have been subjected to coordinate transformation in the image coordinate transforming section 48 using a second image correction factor for removing image distortion in the reference image which can be obtained when the relative tilt angle created by the sample tilting section 5 is in a standard state. The second correction factor measuring section 56 obtains a correction factor by comparing the shape or coordinate values of the reference template 9a or 9c measured based on the stereo image with the shape or coordinate values of characteristic points. The reference template database 58 stores the positions of the targets on the reference template 9a and 9c. The coordinate measuring section 52 obtains the shape or coordinate values of the sample included in a stereo image composed of images converted from the non-reference image and reference image in the second image coordinate transforming section 54.

Figure 23:
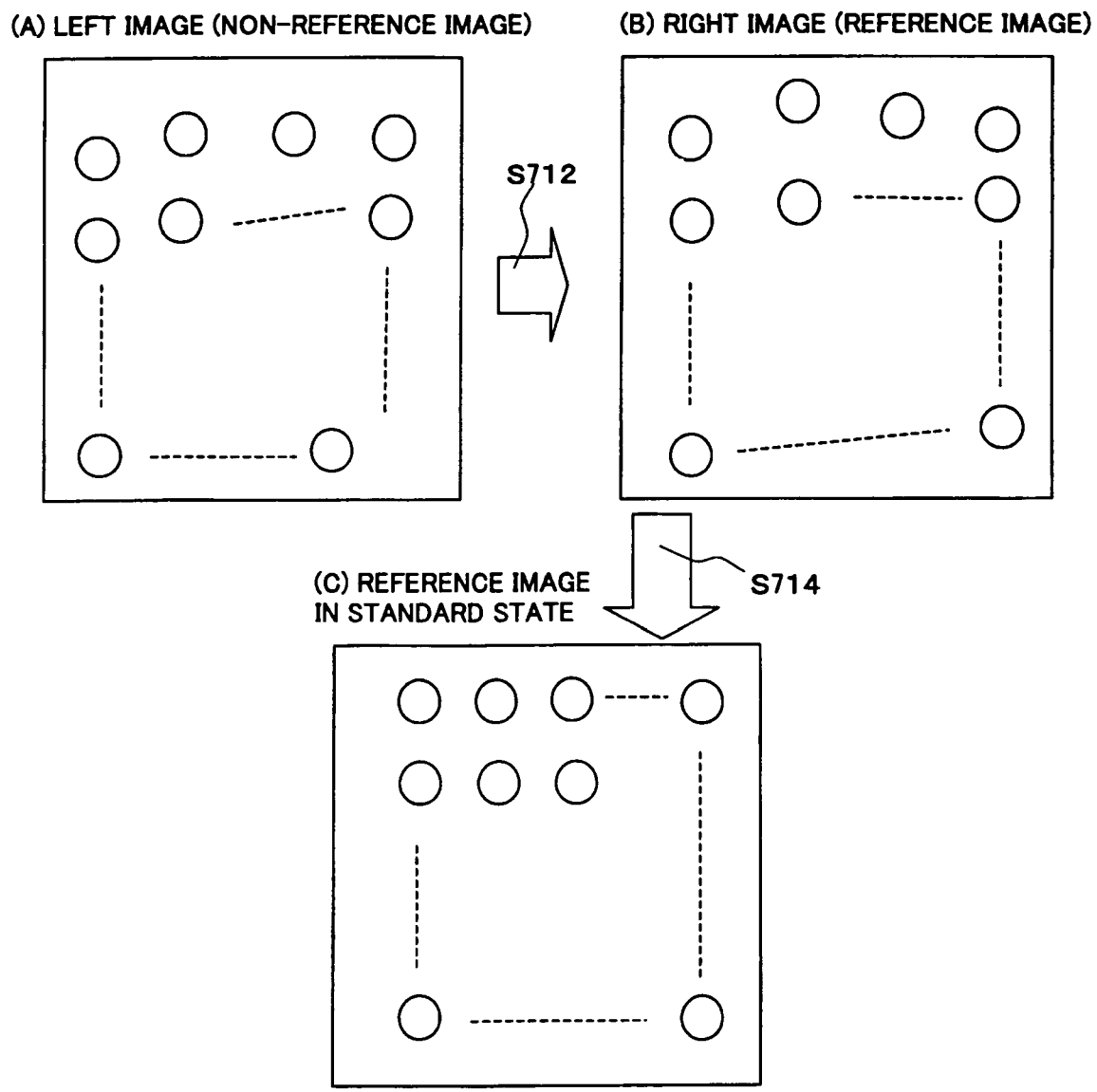
FIG. 23 is a view used to explain right and left images stored in an original right and left images storing section and an image in a standard state.

Referring to FIG. 23 and others, the procedure for acquiring a stereo image in the apparatus constituted as described above will be described. FIG. 23 is a view used to explain the right and left images stored in the original right and left images storing section and an image in the standard state. In FIG. 23, (A) shows a non-reference image, (B) shows a reference image or an image converted from the non-reference image, and (C) shows an image in a standard state processed in the image coordinate transforming section. The non-reference image is converted into the reference image in the standard state using the first image correction factor (see step S712 in FIG. 25). The image shown in FIG. 23(B) is further processed in the image coordinate transforming section (see step S714 in FIG. 25).

Figure 24:
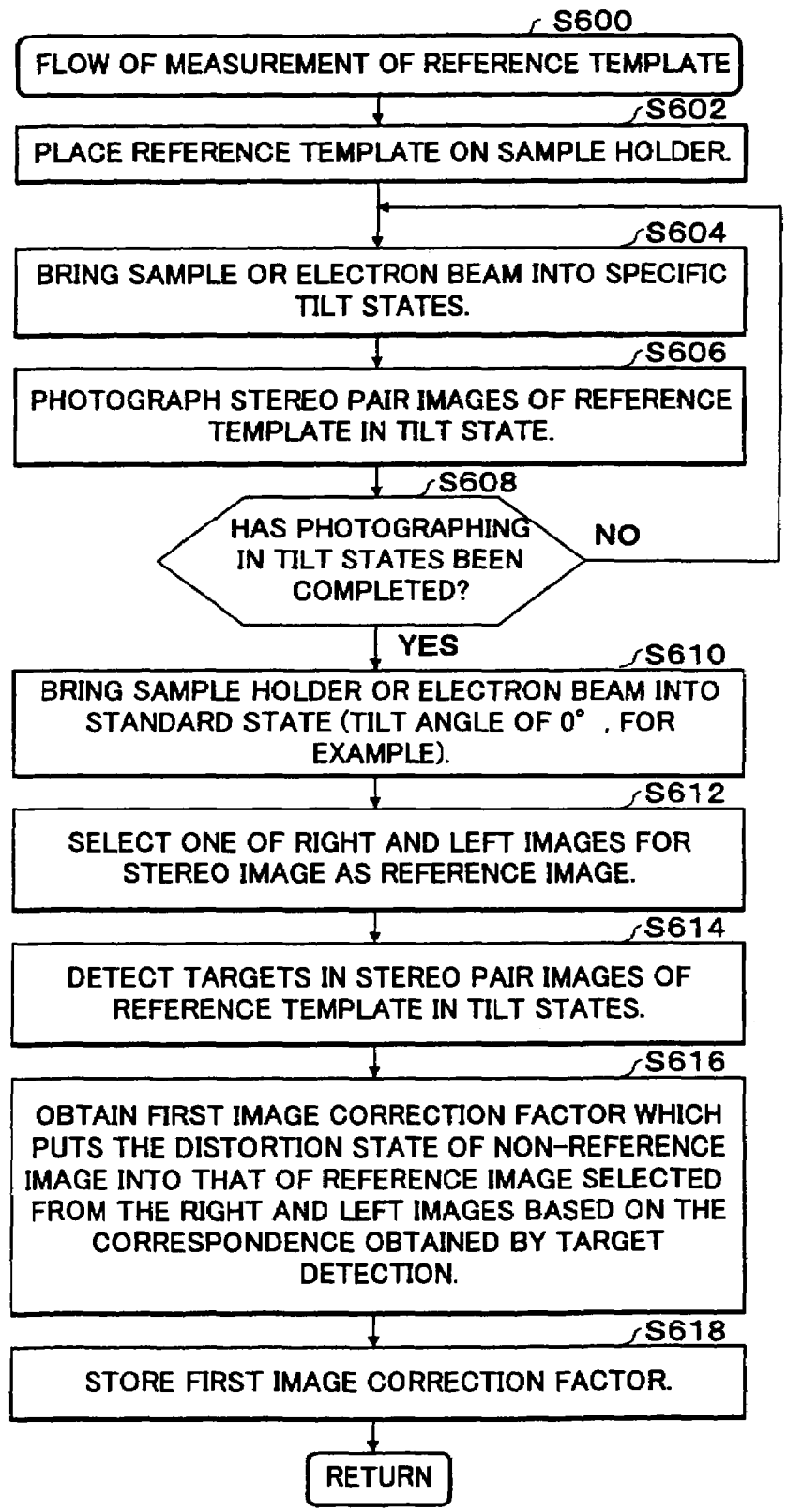
FIG. 24 is a flowchart of a reference template in the fifth embodiment.

FIG. 24 is a flowchart of a reference template used to explain a fifth embodiment of this invention. FIG. 24 shows a flow of measurement of a correction factor for an image conversion process using the reference template 9a or 9c (S600). The reference templates 9a or 9c is placed on the sample holder 3 (S602). The sample holder 3 or the electron beam 7 is brought into a tilt state (S604). For example, the beam tilt control section 5a sends a tilt control signal to the sample holder 3 and the incident angle adjusting section 22 adjusts the incident angle of the electron beam 7 relative to the object 9. The tilt angle is set with respect to the tilt angle of the reference template 9a or 9c to be measured. For example, the tilt angle is set to the tilt state shown in FIG. 3(A) or FIG. 3(B). When there are a plurality of tilt angles, images are acquired at all the tilt angles at which measurement may be performed.

The electron beam measuring device 20a acquires tilt images of the reference template from the electron beam detecting section 4 (S606). The electron beam measuring device 20a determines whether the number of acquired images has reached that required in the tile image acquiring process (S608). When the required number of images have not been acquired yet in step S608, the procedure goes back to step S604 and more images are acquired. When the required number of images have been acquired in step S608, an image of the reference template in the reference tilt state such as an image at a horizontal state (at a tilt angle of 0°) is acquired (S610). When the design values or measurement values of the reference template 9a or 9c have been known, the design values or measurement values may be used instead of or in addition to the image measurement. When the beam system is adjusted at a tilt angle of 0°, an image of the reference templates at a tilt angle of 0° may be used as the image in the standard state.

Then, the electron beam measuring device 20a performs a variable and coefficient acquiring process (S612 to S618). The reference image selecting section 40 selects one of the stereo pair tilt images, that is, one of the right and left images for a stereo image obtained from the electron beam detecting section 4 as a reference image (S612). Then, targets are detected in the stereo pair tilt images (S614). When a reference image at a tilt angle of 0° has been acquired, targets are also detected in the reference image. In this case, since the approximate positional relations among the characteristic points have been known, erroneous correspondence can be avoided. Thus, even when there are points similar to the targets in the images, image measurement can be carried out by designating several points (automatic recognition) according to the following sequential steps (i) to (v).

The steps are generally the same as those described in the description of the example shown in FIG. 11.

(i) Reading out the approximate positions of the patterns when the sample is a semiconductor chip. When the design values or the interval between the patterns have been known, the known values are used. These are set as reference coordinates.

(ii) Designating at least three points each on the reference image and the search image corresponding to each other. These are set as image coordinates.

(iii) Calculating parameters for the reference image and search image from the following equations. That is, an observation equation is established by putting the image coordinates and corresponding reference point coordinates into the quadratic projection conversion equation (1) described before to obtain the parameters b1 to b8.

(iv) Obtaining the positions of all the patterns on the reference image and the search image by calculation using the parameters b1 to b8.

(v) Performing a stereo matching process on the areas around the thus obtained positions corresponding to the patterns and performing measurement.

A stereo matching process is performed by the method described with reference to FIG. 12.

[Affine Transformation Equation]

Here, affine transformation as an example of image transformation processing will be described.

$$x'=b1x+b2y+b3$$

$$y'=b4x+b5y+b6 \quad (5)$$

The coefficients b1 to b6 can be calculated by successive approximation method when at least four points on the right and left images corresponding to each other can be measured. Thus, the coefficients can be calculated by associating the stereo pair right and left images using coordinate values obtained by target detection. Then, conversion coefficient are calculated in the same manner from the detected positions in the reference image selected in step S612 and the positions or the reference values (design values) of the targets in the image acquired at a tilt angle of 0°.

Figure 25:
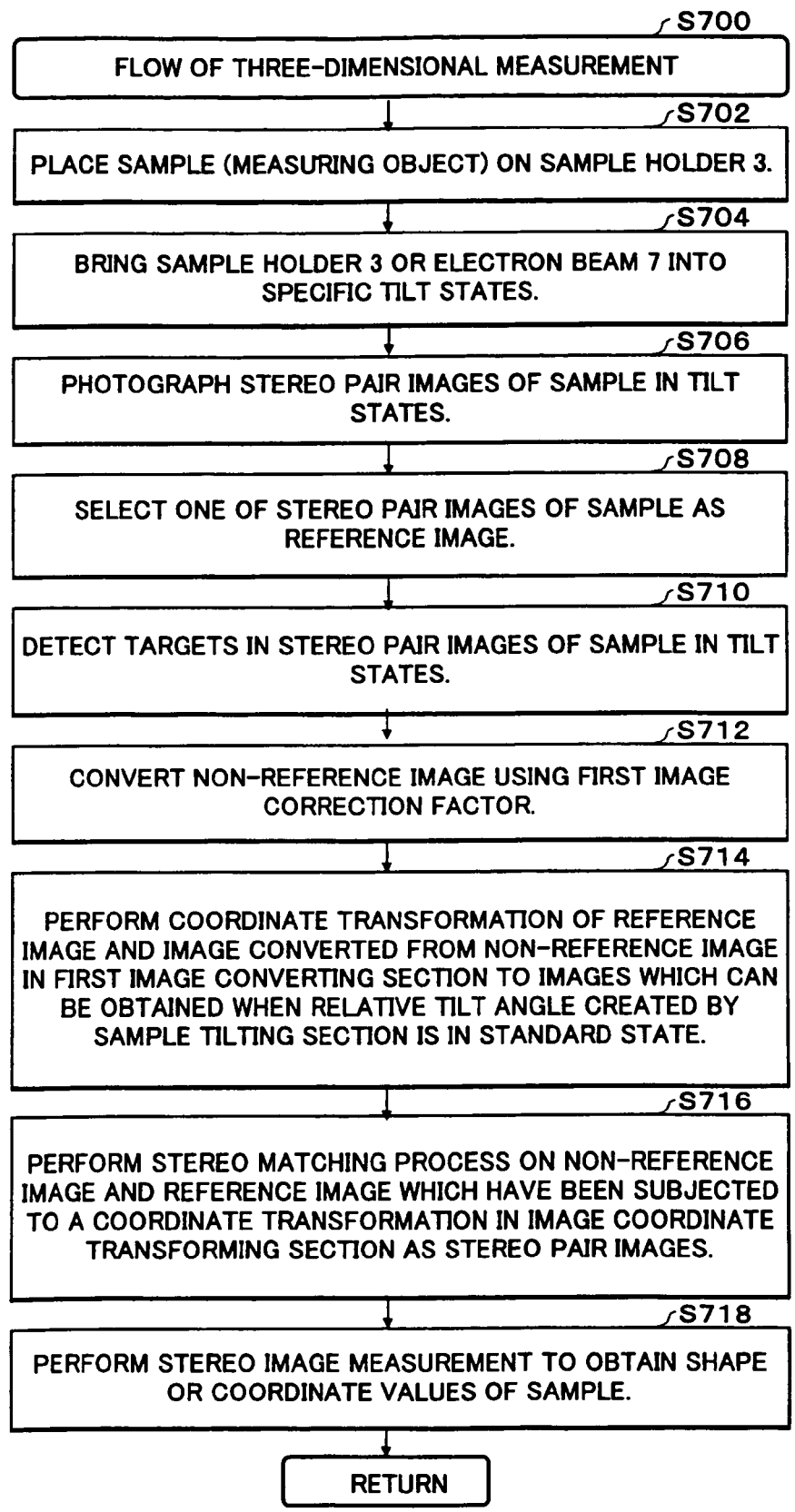
FIG. 25 is a flowchart of three-dimensional image measurement of the sample 9 in the fifth embodiment.

FIG. 25 is a flowchart of three-dimensional measurement of the sample 9 in a fifth embodiment of this invention. FIG. 25 shows a flow of three-dimensional measurement of the sample 9 using the first image correcting coefficient obtained as shown in FIG. 24 (S700). A measuring object 9 is placed on the sample holder 3 (S702). The electron beam 7 or the sample holder 3 is brought into desired tilt states (S704). As the desired tilt states, angles at which as much of the sample 9 as possible can be viewed or angles at which the targets necessary to be measured can be well photographed are selected so that three-dimensional measurement of the sample 9 can be performed with reliability. Then, stereo pair images of the sample 9 in the desired tilt states are acquired (S706). The reference image selecting section 40 selects one of the stereo pair images, that is, the right and left images for a stereo image obtained from the electron beam detecting section 4 as a reference image (S708). Then, targets in the stereo pair tilt images are detected (S710).

The first image converting section 46 converts the non-reference image of the stereo pair right and left images using the first image correction factor (S712). The image coordinate transforming section 48 performs a coordinate transformation of the reference image and an image converted from the non-reference image in the first image converting section 46 into images which can be obtained when the relative tilt angle created by the sample tilting section 5 is in a standard state (S714). The coordinate measuring section 52 performs a stereo matching process on the non-reference image and the reference image which have been subjected to a coordinate transformation in the image coordinate transforming section 48 as stereo pair images (S716).

The coordinate measuring section 52 performs stereo image measurement and calculates the three-dimensional coordinates of the photographed sample 9 to obtain the shape or coordinate values of the sample (S718). The stereo matching process is performed after the processes of the first image converting section 46 and the image coordinate transforming section 48 in the above embodiments, this invention is not limited thereto. The stereo matching process may be performed after the process of the first image converting section 46 and before the process of the image coordinate transforming section 48.

The second image converting section 54 may perform a step of converting the reference image and non-reference image which have been subjected to a coordinate transformation in the second image converting section 48 using a second image correction factor for removing distortion in a reference image with respect to an image which can be obtained when the relative tilt angle created by the sample tilting section 5 is in a standard state between steps S714 and S716. In the case where the distortion in images photographed in tilt states suitable to photograph the sample and the distortion in an image photographed when the relative tilt angle created by the sample tilting section is in a standard state are different in the electron beam device 10, when the non-reference image and reference image which have been subjected to a coordinate transformation in the image coordinate transforming section 48 are corrected using the second image correction factor in the second image converting section 54, the coordinate measuring section can obtain the precise shape or the coordinate values of the sample.

[Measurement of Height]

Description will be made of a case in which a parameter for correcting the lens distortion in the height direction of the measuring object 9 is included in the first image correcting coefficient. The height of the sample 9 placed on the sample holder 3 can be corrected at each of the tilt angle Φ as shown in FIG. 3(B). Thus, space correction is performed at the angles and height distortion correction factor at each angle may be included in the first image correction factor and stored. Photographing the measuring object 9 tilted at an angle of Φ is equivalent to photographing the measuring object 9 with an electron beam 7 tilted at an angle Φ by an electron beam or observation optical axis tilting mechanism. The coordinate system of the sample holder 3 has been described with the perspective view of FIG. 15. That is, in the coordinate system of the sample holder 3, the Y-axis is the axis of rotation, and the clockwise turn is taken to be the + direction of the angle θ.

The relation between the image and the sample at the time when the electron beam is irradiated on the measuring object 9 has been described with reference to FIG. 16.

Thus, lens distortion in the height direction of the measuring object 9 in the stereo pair tilt images is corrected using the equation (12) or (14) depending on the tilt state of the sample 9. That is, the first correction factor measuring section 44 and the first image converting section 46 of the electron beam measuring device 20a generate lens distortion-corrected stereo pair images of the measuring object 9 using the approximate position and height of the measuring object 9 and the height correcting parameter included in the first image correction factor. The generated stereo pair images of the measuring object 9 can be displayed on a display device such as a CRT of the electron beam measuring device 20a.

In the fifth embodiment, one of the right and left images as a stereo pair is selected as a reference image, the coordinates of the non-reference image are transformed to the image coordinates of the reference image, a stereo matching process is performed on the images, the images are transformed to reference coordinates, and three-dimensional coordinates of the sample 9 are calculated (see FIG. 25). When the non-reference image is converted to the image coordinates of the reference image, occurrence of miss matching in the stereo matching process can be reduced by correcting the distortions in the right and left images and the reliability of the stereo matching can be increased.

Sixth Embodiment

Figure 26:
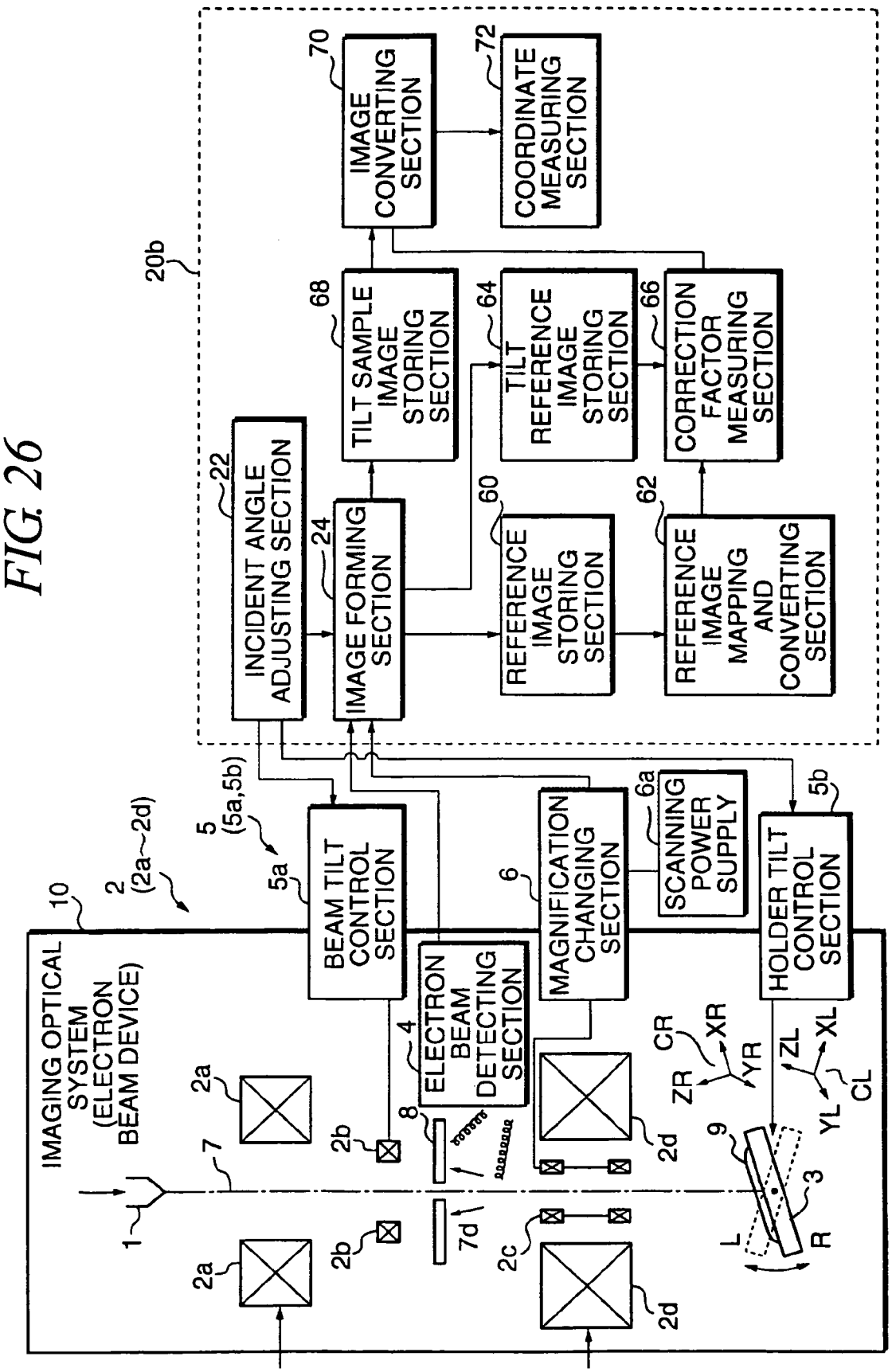
FIG. 26 is a block diagram illustrating the entire structure of a sixth embodiment of this invention.

FIG. 26 is a block diagram illustrating the structure of a sixth embodiment of this invention. As shown in the drawing, the electron beam measuring device 20b has an incident angle adjusting section 22, an image forming section 24, a reference image storing section 60, a reference image mapping and converting section 62, a tilt reference image storing section 64, a correction factor measuring section 66, a tilted sample image acquiring section 68, an image converting section 70 and a coordinate measuring section 72.

The reference image storing section 60 stores an image of the reference template obtained when the relative tilt angle created by the sample tilting section 5 is in a standard state as a reference image. The reference image mapping and converting section 62 maps the reference image stored in the reference image storing section 60 into images at sample photographing tilt angles. The tilt reference image storing section 64 photographs the reference template 9a or 9c at the sample photographing tilt angles created by the sample tilting section 5 with the electron beam detection section 4 to acquire tilt reference images.

The correction factor measuring section 66 compares the images mapped from the reference image in the reference image mapping and converting section 62 with the reference template image stored in the tilt reference image storing section 64 to obtain an image correction factor for removing image distortion in the reference template image. When a three-dimensional reference template 9c is used as a reference template, the reference marks on the three-dimensional reference template 9c are associated with at least two heights. Thus, the correction factor measuring section 66 also acquires a lens distortion correcting parameter for correcting the lens distortion (especially distortion in the height direction) of the electron optical system 2, and the coordinate measuring section 52 corrects the lens distortion included in detection data obtained at plurality of tilt angles, using the lens distortion correcting parameter. The correction of the lens distortion has been described in the section [Measurement of Height].

The tilted sample image acquiring section 68 photographs the sample at sample photographing tilt angle created by the sample tilting section 5 with the electron beam detecting section 4 and acquires the images as a stereo pair images. The image converting section 70 converts the sample images at the sample photographing tilt angles using the image correction factor obtained in the correction factor measuring section 66. The coordinate measuring section 72 obtains the shape or coordinate values of the sample included in a stereo image composed of the images converted from the sample images in the image converting section 70 by image measurement.

Figure 27:
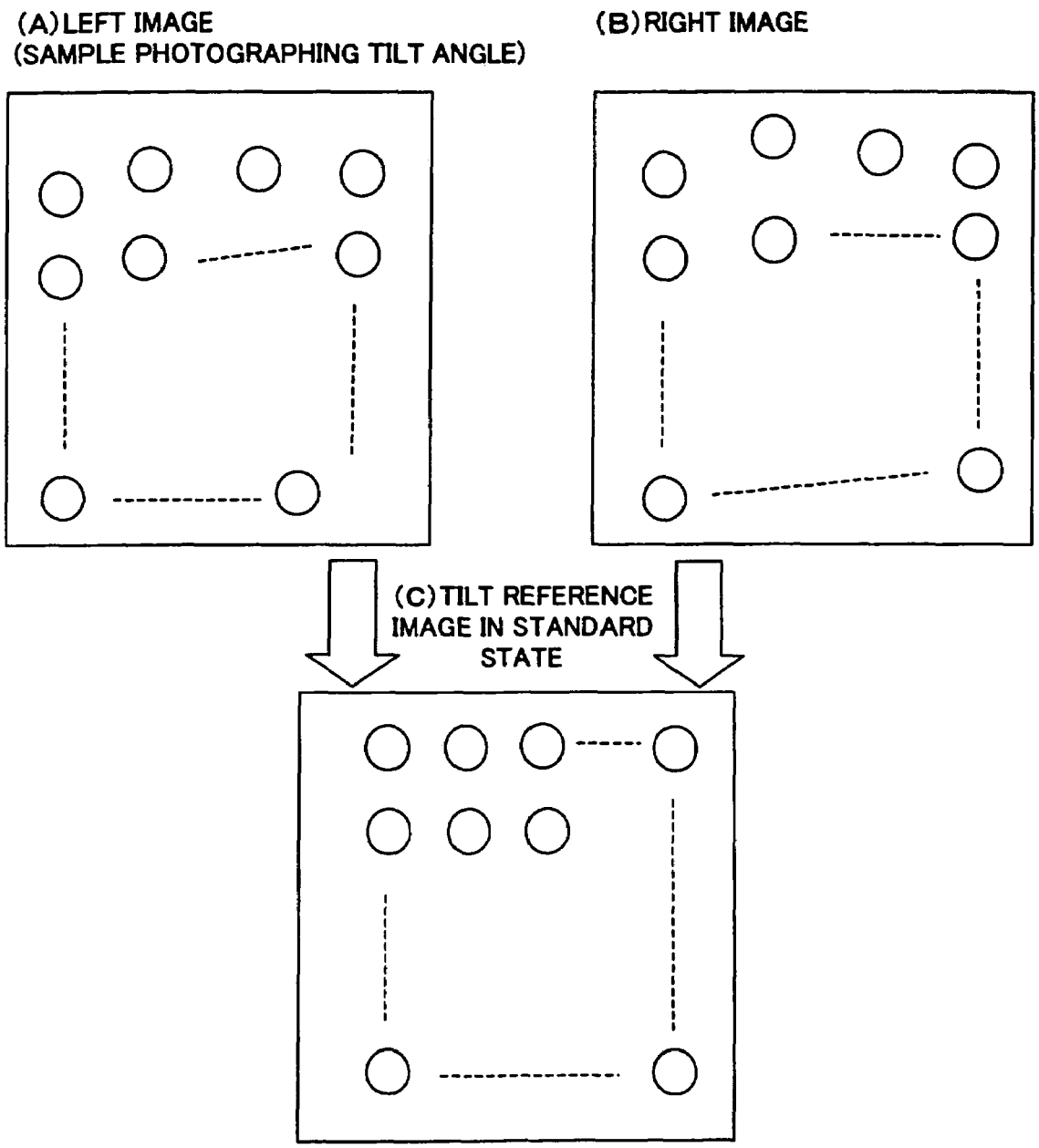
FIG. 27 is a view used to explain right and left images stored in a tilted sample image acquiring section and an image stored in a tilt reference image storing section.

Description will be made of the procedure for acquiring a stereo image in the apparatus constituted as described above. FIG. 27 is a view used to explain right and left images stored in the tilted sample image acquiring section and the tilt reference image stored in the tilt reference image storing section. In FIG. 27, (A) shows the left image stored in the tilted sample image acquiring section, (B) shows the right image stored in the tilted sample image acquiring section, and (C) shows a tilt reference image stored in the tilt reference image storing section or an image in a standard state processed in the image converting section. In the sixth embodiment, the right and left images are separately converted to distortion of the reference and a stereo matching process is performed. Thus, the amount of operation is smaller than the fifth embodiment in which the image conversion process on the non-reference image has two stages: image correction based on a reference image and a coordinate transformation to a reference tilt image.

Figure 28:
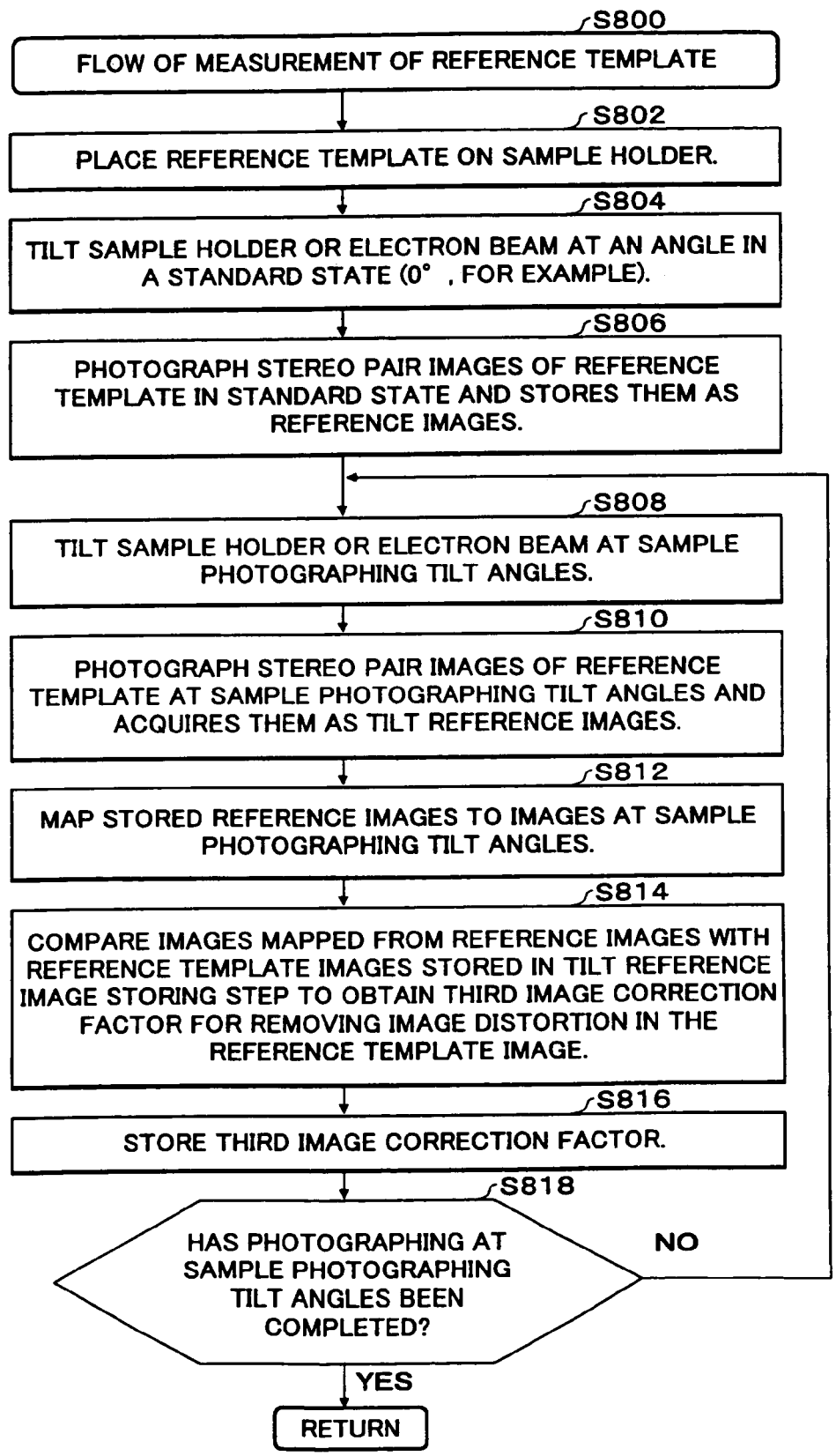
FIG. 28 is a flowchart of a reference template in the sixth embodiment.

FIG. 28 is a flowchart of a reference template used to explain a sixth embodiment of this invention. FIG. 28 shows a flow of measurement of a third image correction factor for image conversion processing using the reference template 9a or 9c (S800). The reference template 9a or 9c is placed on the sample holder 3 (S802). The sample holder or the electron beam 7 is tilted at an angle in a standard state (0°, for example) (S804). The standard state is set for the template 9a or 9c to be measured. For example, the standard state is set to the horizontal state shown in FIG. 3(A) and an intermediate tilt state shown in FIG. 3(B). In the imaging optical system, reference images of the template 9a or 9c obtained from the electron beam detecting section 4 are photographed as stereo pair images and the reference image storing section 60 acquires them as reference images (S806).

The electron beam measuring device 20b brings the sample holder 3 or the electron beam 7 into a sample photographing tilt angle (S808). The imaging optical system photographs a stereo pair images of the reference template 9a or 9c at the sample photographing tilt angle and the tilt reference image storing section 64 stores them as tilt reference images (S810).

The reference image mapping and converting section 62 maps the reference image stored in the reference image storing section 60 into images at the sample photographing tilt angles (S812). The correction factor measuring section 66 compares the images mapped from the reference image in the reference image mapping and converting section 62 and the reference template images stored in the tilt reference image storing section 64 to obtain an image correction factor for removing image distortion in the reference template image (S814). The correction factor measuring section 66 stores the image correction factor in a state that can be used by the image converting section 70 (S816). The electron beam measuring device 20b determines whether photographing of the sample 9 at the sample photographing tilt angles has been completed (S818). If the photographing has not been completed yet, the procedure goes back to step S808 and another sample photographing tilt angle is set. If the photographing has been completed, photographing of the reference template 9a or 9c is finished and the procedure is returned.

Figure 29:
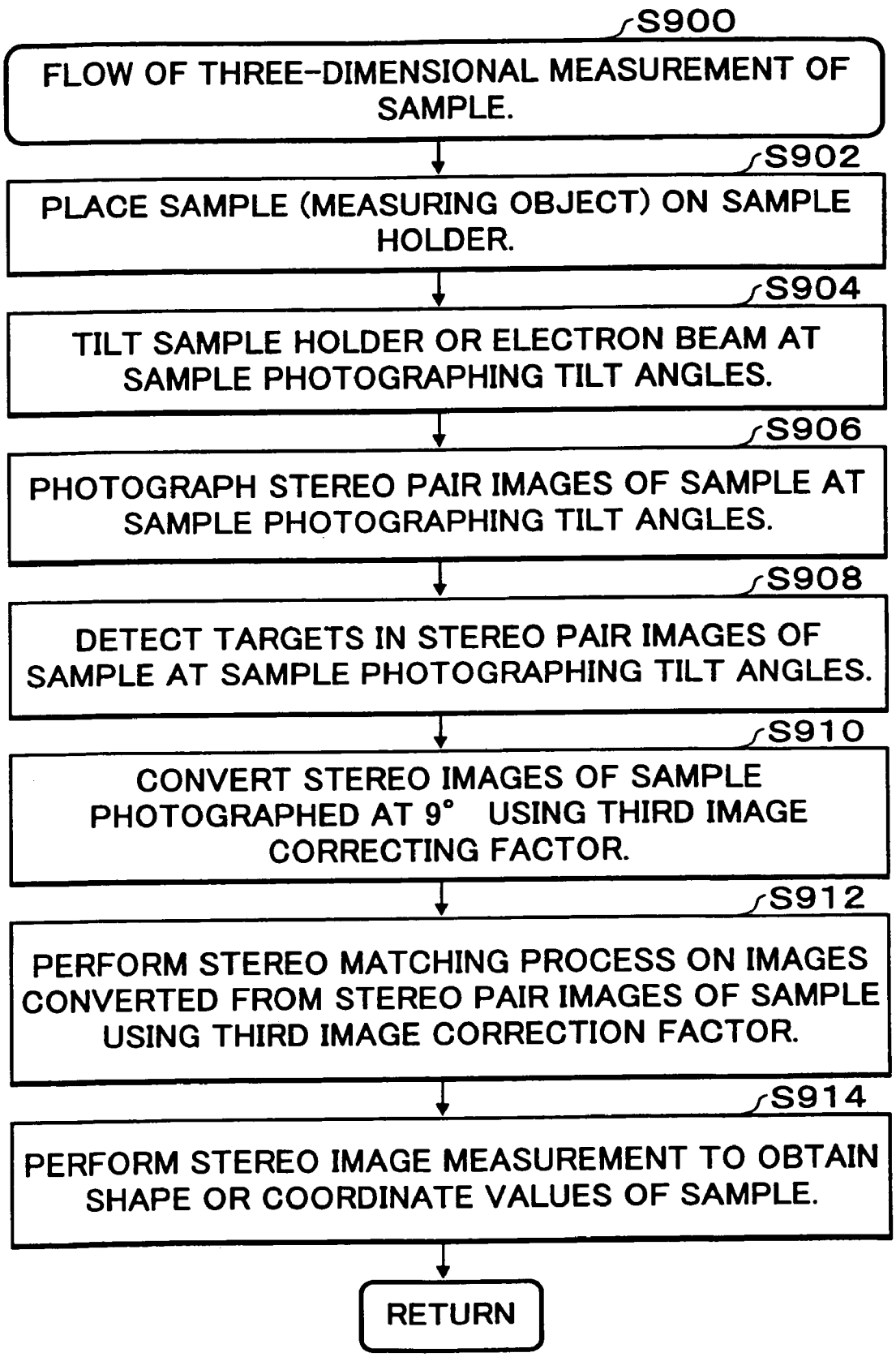
FIG. 29 is a flowchart of three-dimensional image measurement of the sample 9 in the sixth embodiment.

FIG. 29 is a flowchart of three-dimensional measurement of the sample 9 in the sixth embodiment of this invention. FIG. 29 shows a flow of three-dimensional measurement of the sample 9 using the image correction factor obtained-in the process shown in FIG. 28 (S900). A measuring object 9 is placed on the sample holder 3 (S902). The electron beam 7 or the sample holder 3 is tilted at sample photographing tilt angles (S904). As the sample photographing tilt angles, angles at which as much of the sample 9 as possible can be viewed or angles at which the targets necessary to be measured can be well photographed is selected so that three-dimensional measurement of the sample 9 can be performed with reliability. The tilted sample image acquiring section 68 acquires stereo pair images of the measuring object 9 at the sample photographing tilt angle (S906). The image converting section 70 detects targets on the stereo pair images of the sample 9 photographed at the sample photographing tilt angle (S908).

The image converting section 70 converts the sample image at the sample photographing tilt angle acquired in the tilted sample image acquiring section 68 using the image correction factor obtained in the correction factor measuring section 66 (S910). The coordinate measuring section 72 performs a stereo matching process on the images converted from the sample images in the image converting section 70 as stereo pair images (S912). The coordinate measuring section 72 performs a stereo image measurement and calculates the three-dimensional coordinates of the photographed sample 9 to obtain the shape or coordinate values of the sample (S914).

In the sixth embodiment, since stereo pair images of the sample photographed at the sample photographing tilt angle is converted into stereo pair images of the sample photographed at a standard tilt angle, it is easy to convert stereo images of the sample photographed at a photographing angle into stereo images photographed in an attitude suitable for the purpose. When the measuring object 9 is a mass production product such as a semiconductor chip, the height and positional information of the measuring object 9 is known in advance, stereo pair images of the sample at a reference tilt angle suitable for process management can be easily obtained.

Seventh Embodiment

Figure 30:
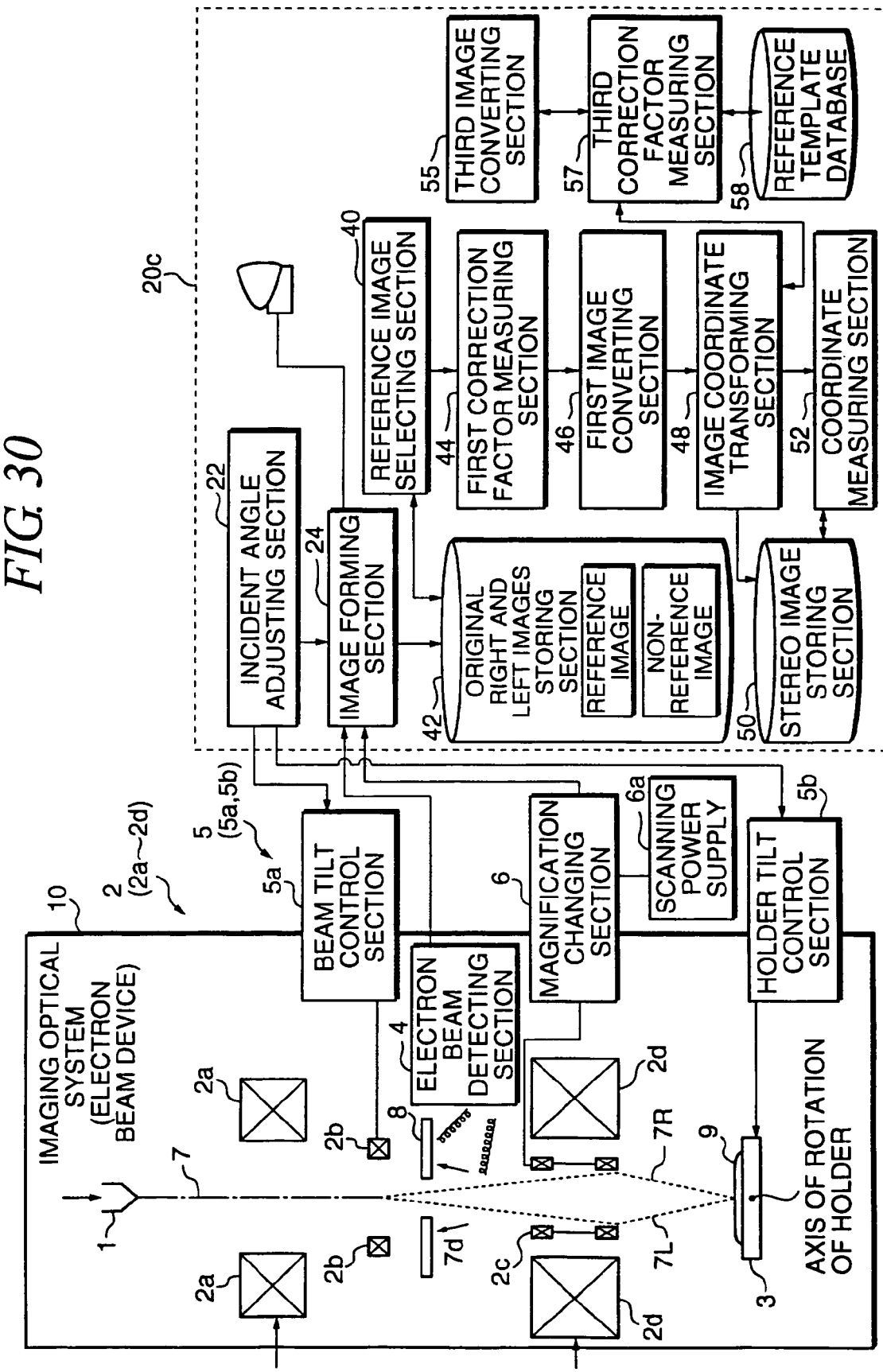
FIG. 30 is a block diagram illustrating the structure of a seventh embodiment of this invention.

FIG. 30 is a block diagram illustrating the structure of a seventh embodiment of this invention. In the seventh embodiment, the electron beam of the scanning microscope is deflected to obtain a stereo image, while the holder is tilted to obtain a stereo image in the fifth and sixth embodiments. Those parts corresponding to the components of FIG. 22 are identified with the same numerals in FIG. 30, and their description is not repeated. A beam tilt control section 5a for controlling the tilt of the electron beam 7 is provided as the tilt control section 5. The beam tilt control section 5a sends a tilt control signal to the deflection lenses 2b so that the electron beam is switched to be an electron beam 7R which makes a first incident angle formed by the sample holder 3 and the electron beam 7 or an electron beam 7L which makes a second incident angle. The beam tilt control section 5a may be able to adjust the relative tilt between the electron beam 7 and the sample holder 3 to a plurality of angles. At least two angles are necessary to obtain data for stereo detection.

The electron beam measuring device 20c has a third image converting section 55 and a third image correction factor measuring section 57 in addition to an incident angle adjusting section 22, an image forming section 24, a reference image selecting section 40, an original right and left images storing section 42, a first correction factor measuring section 44, a first image converting section 46, an image coordinate transforming section 48, a stereo image storing section 50, a coordinate measuring section 52, a reference template database 58. The third image converting section 55 converts the reference image and an image converted from the non-reference image in the first image converting section 46 using a third image correction factor for removing the distortion in the reference image with respect to an image which can be obtained when the relative tilt angle created by the sample tilting section 5 is in a standard state. The third image correction factor measuring section 57 measures a third image correction factor by comparing the shape or coordinate values of the reference template 9a or 9c measured based on the stereo image with the shape or coordinate values of characteristic points.

Although the attitude of the object is adjusted around one single neutral axis in the above embodiments, this invention is not limited thereto. A plurality of tilt axes may be selected. When a plurality of tilt axes are used, correction can be made in various directions and three-dimensional measurement can be performed with high accuracy.

INDUSTRIAL APPLICABILITY

As has been described previously, in the electron beam system and the electron beam measuring method of this invention, an image correcting section corrects a stereo image according to the tilt angle created by a sample tilting section using a correction factor at a reference angle with respect to a plane which is used to tilt the sample obtained based on the shape or coordinate values of a sample in an approximate coordinate measuring section and stored in a correcting factor storing section. Thus, the electron beam system and the electron beam measuring method of this invention are suitable to perform three-dimensional measurement of a sample with high precision using images of the sample photographed with an electron microscope. Also, the electron beam device as an electron beam system and the observing method of this invention is suitable to perform three-dimensional observation of a sample with high accuracy using images of the sample photographed with an electron microscope.

[Description of Reference Numerals]
9: sample (measuring object)
9a, 9c: reference template
10: electron beam device
20, 20a, 20b, 20c: electron beam measuring device
22: incident angle adjusting section
24: image forming section
26: stereo image retaining section
28: approximate coordinate measuring section
30: image correcting section
32: correction factor storing section
34: precise coordinate measuring section
36: lens distortion correcting parameter acquiring section
38: correction factor calculating section
39: reference template database
40: reference image selecting section
42: original right and left images storing section
44: first correction factor measuring section
46: first image converting section
48: image coordinate transforming section
50: coordinate measuring section
54: second image converting section
56: second correction factor measuring section
60: reference image storing section
62: reference image mapping and converting section
64: tilt reference image storing section
66: correction factor measuring section
68: tilted sample image acquiring section
70: image converting section
72: coordinate measuring section

What is claimed is:

1. An electron beam system connected to an electron beam device having an electron beam source for emitting an electron beam; an electron optical system for irradiating the electron beam on a sample; a sample holder for holding the sample; a sample tilting section for relatively tilting the sample holder and the electron beam so that a stereo image of the sample can be acquired; and an electron beam detecting section for detecting an electron beam emitted from the sample, comprising:

a reference image selecting section for selecting one of right and left images for a stereo image obtained from the electron beam detecting section, as a reference image;

a first correction factor measuring section for obtaining a first image correction factor which distorts the non-reference image into the distortion state of the reference image using the correspondence between the right and left images:

a first image converting section for converting the non-reference image using the first image correction factor obtained in the first correction factor measuring section;

an image coordinate transforming section for performing a coordinate transformation of the reference image and an image converted from the non-reference image in the first image converting section to images which can be obtained when the relative tilt angle created by the sample tilting section is in a standard state; and a coordinate measuring section for obtaining the shape or coordinate values of the sample included in a stereo image composed of the reference image and the non-reference image which have been subjected to a coordinate transformation in the image coordinate transforming section.

2. The electron beam system according to claim 1, further comprising a second image converting section for converting the reference image and the non-reference image which have been subjected to a coordinate transformation in the image coordinate transforming section using a second image correction factor for removing the distortion in the reference image with respect to an image which can be obtained when the relative tilt angle created by the sample tilting section is in a standard state, wherein the coordinate measuring section obtains the shape or coordinate values of the sample included in a stereo image composed of images converted from the non-reference image and the reference image in the second image converting section.

3. The electron beam system according to claim 2, wherein the sample tilting section relatively tilts the sample holder and the electron beam by at least one of two ways of a first tilt angle changing way in which the direction in which the electron optical system irradiates electron beam is changed with respect to the sample and a second tilt angle changing way in which the sample holder is tilted with respect to the electron beam.

4. The electron beam system according to claim 1, further comprising a third image converting section for converting the reference image and an image converted from the non-reference image in the first image converting section using a third image correction factor for removing image distortion in the reference image with respect to an image which can be obtained when the relative tilt angle created by the sample tilting section is in a standard state, wherein the image coordinate transforming section performs a coordinate transformation of images converted from the reference image and the non-reference image in the third image converting section into images which can be obtained when the relative tilt angle created by the sample tilting section is in a standard state.

5. The electron beam system according to claim 4, wherein the sample tilting section relatively tilts the sample holder and the electron beam by at least one of two ways of a first tilt angle changing way in which the direction in which the electron optical system irradiates electron beam is changed with respect to the sample and a second tilt angle changing way in which the sample holder i stilted with respect to the electron beam.

6. The electron beam system according to claim 1, wherein the sample tilting section relatively tilts the sample holder and the electron beam by at least one of two ways of a first tilt angle changing way in which the direction in which the electron optical system irradiates electron beam is changed with respect to the sample and a second tilt angle changing way in which the sample holder is tilted with respect to the electron beam.

7. The electron beam system according to claim 1, wherein the correction factor is obtained in the correction factor measuring section by:

placing a reference template having characteristic points of which the shape or coordinate values have been known in advance on the sample holder;

relatively tilting the sample holder and the electron beam with the sample tilting section;

acquiring a stereo image of the reference template with the electron beam detecting section; and comparing the characteristic points on the reference template and the shape and coordinate values of the characteristic points on the reference template measured based on the stereo image with the coordinate measuring section.

8. The electron beam system according to claim 7, the reference template has reference marks associated with at least two heights;

the first correction factor measuring section acquires a lens distortion correcting parameter for use in correcting the lens distortion of the electron optical system; and wherein the first image converting section corrects the lens distortion included in image data corrected using the first image correction factor, using the lens distortion correcting parameter.

9. The electron beam system according to claim 7, wherein the reference template is constituted of a two-dimensional chart;

the reference template is held at a first tilt angle created by relatively tilting the sample holder and the electron beam to acquire a stereo image, with the sample tilting section;

the reference template is also held at a second tilt state different from the first tilt angle;

the electron beam detecting section acquires images of the reference template in the first tilt angle and second tilt state; and the first correction factor measuring section obtains the first image correction factor based on the images of the reference template in the first tilt angle and second tilt state.

10. An electron beam measuring method for measuring the shape of a sample using an electron beam device having an electron beam source for irradiating an electron beam; an electron optical system for irradiating the electron beam on a sample; a sample holder for holding the sample; a sample tilting section for relatively tilting the sample holder and the electron beam; and an electron beam detecting section for detecting an electron beam emitted from the sample, comprising:

a reference image selecting step of selecting, as a reference image, one of right and left images for a stereo image obtained from the electron beam detecting section;

a first correction factor measuring step of obtaining a first image correction factor which distorts a non-reference image into a distortion state of the reference image, using the correspondence between the right and left images;

a first image converting step of converting the non-reference image using the first image correction factor;

an image coordinate transforming step of performing a coordinate transformation of the reference image and an image converted from the non-reference image in the first image converting step into images which can be obtained when the relative tilt angle created by the sample tilting section is in a standard state;

a coordinate measuring step of obtaining the shape or coordinate values of the sample included in a stereo image composed of the reference image and the non-reference image which have been subjected to a coordinate transformation in the image coordinate transforming step.

* * * * *